(12) United States Patent
Lee

(10) Patent No.: US 9,667,194 B2
(45) Date of Patent: May 30, 2017

(54) DIFFERENTIAL SWITCHED CAPACITOR CIRCUITS HAVING VOLTAGE AMPLIFIERS, AND ASSOCIATED METHODS

(71) Applicant: Omni Design Technologies Inc., Milpitas, CA (US)

(72) Inventor: Hae-Seung Lee, Lexington, MA (US)

(73) Assignee: Omni Design Technologies Inc., Milpitas, CA (US)

(*) Notice: Subject to any disclaimer, the term of this patent is extended or adjusted under 35 U.S.C. 154(b) by 0 days.

(21) Appl. No.: 15/050,580

(22) Filed: Feb. 23, 2016

(65) Prior Publication Data

US 2016/0248380 A1 Aug. 25, 2016

Related U.S. Application Data

(60) Provisional application No. 62/120,094, filed on Feb. 24, 2015.

(51) Int. Cl.
*H03F 1/02* (2006.01)
*H03F 1/26* (2006.01)
*H03F 3/45* (2006.01)

(52) U.S. Cl.
CPC .......... *H03F 1/0205* (2013.01); *H03F 1/26* (2013.01); *H03F 3/45183* (2013.01); *H03F 3/45475* (2013.01); *H03F 2203/45116* (2013.01); *H03F 2203/45156* (2013.01); *H03F 2203/45318* (2013.01); *H03F 2203/45512* (2013.01); *H03F 2203/45514* (2013.01); *H03F 2203/45551* (2013.01)

(58) Field of Classification Search
CPC .............................. H03F 3/45; H03F 3/45892
USPC ....................................................... 330/9, 252
See application file for complete search history.

(56) References Cited

U.S. PATENT DOCUMENTS

| | | | |
|---|---|---|---|
| 4,020,363 A | 4/1977 | Numata et al. | |
| 5,001,725 A | 3/1991 | Senderowicz et al. | |
| 6,087,897 A * | 7/2000 | Wang .................. | H03F 3/45479 327/124 |
| 7,167,119 B1 * | 1/2007 | Lei ........................ | H03M 3/342 341/143 |
| 2014/0266845 A1 | 9/2014 | Lee | |
| 2014/0292375 A1 * | 10/2014 | Angelini .................. | G06G 7/00 327/94 |
| 2015/0255173 A1 * | 9/2015 | Tokunaga ............... | H03F 3/005 341/172 |

OTHER PUBLICATIONS

US International Searching Authority, "International Search Report—App. No. PCT/US16/19035", Jul. 8, 2016, WIPO.

* cited by examiner

*Primary Examiner* — Henry Choe
(74) *Attorney, Agent, or Firm* — Intrinsic Law Corp.

(57) ABSTRACT

Switched capacitor circuits and charge transfer methods comprising a sampling phase and a transfer phase. Circuits and methods are implemented via a plurality of switches, a set of at least two capacitors, at least one voltage amplifier, and an operational amplifier. In one example, during the sampling phase at least one input voltage is sampled, and during the transfer phase at least a first reference voltage provided by the at least one voltage amplifier is subtracted from the at least one input voltage using the operational amplifier. The same set of at least two capacitors may be used in both the sampling phase and the transfer phase.

48 Claims, 28 Drawing Sheets

DIFFERENTIAL SWITCHED CAPACITOR CIRCUITS HAVING VOLTAGE AMPLIFIERS, AND ASSOCIATED METHODS

RELATED APPLICATIONS

This application claims the benefit of and priority to U.S. Provisional Application No. 62/120,094, filed on Feb. 24, 2015 and bearing the present title, which is incorporated herein by reference.

TECHNICAL FIELD

The present invention is directed to electrical and electronic circuits, particularly those having differential switched capacitors and voltage amplifier components.

BACKGROUND

Switched capacitor circuits are widely used in analog signal processing circuits (e.g., discrete time sampled signal processing circuits) such as amplifiers, switched capacitor filters, pipeline and algorithmic analog-to-digital converters (ADCs), and delta sigma ADCs. In such circuits, charge is moved into and out of capacitors when switches are opened and closed (typically in a non-overlapping manner). In various implementations, switches generally are operated to sample an analog voltage of interest during a "sampling phase" (e.g., during which the analog voltage of interest is applied across one or more input capacitors); subsequently, during a "transfer phase," the switches are operated to transfer a charge representing the sampled analog voltage to another portion of circuitry for some type of processing of the sampled voltage. In some conventional implementations, an operational amplifier (op amp) is employed as part of the circuitry operable during the transfer phase; the operational amplifier processes the sampled analog voltage and provides a robust ratiometric output voltage as well as load driving capability.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

SUMMARY

Figure 1:
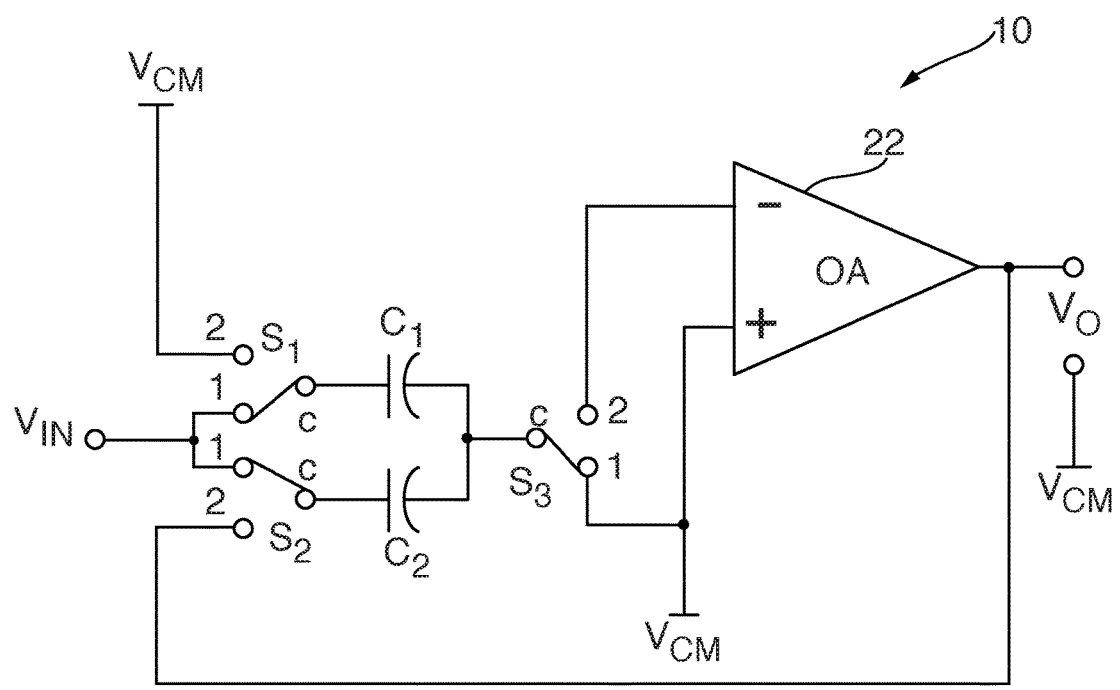
FIG. 1 illustrates a switched capacitor circuit that includes an operational amplifier.

Applicants have recognized and appreciated that an operational amplifier employed in a circuit configuration with a switched capacitor architecture impacts performance of the overall circuit, due to performance limitations of the operational amplifier relating to speed, power consumption, accuracy, and noise. In view of the foregoing, various inventive embodiments disclosed herein generally relate to switched capacitor circuits having one or more voltage amplifiers and an operational amplifier, in which the voltage amplifier(s) mitigate at least some of the limitations imposed on the switched capacitor circuit by the operational amplifier.

In sum, one embodiment is directed to a differential switched capacitor circuit operable in a sampling phase and a transfer phase. The switched capacitor circuit comprises: a plurality of switches; a first and a second input capacitor, each capacitor having the first capacitance value; a first and a second integration capacitor, each capacitor having the second capacitance value; at least one voltage amplifier; and a differential operational amplifier. The voltage gain of the at least one voltage amplifier is related to the inverse of second capacitance value. During the sampling phase, the plurality of switches are configured to couple a first input voltage to the first input capacitor and a second input voltage to the second input capacitor. During the transfer phase, the plurality of switches are configured to couple the first and the second input capacitors, the first and the second integration capacitors, and the at least one voltage amplifier to the operational amplifier to transfer charge from the first and the second input capacitors to the first and the second integration capacitors.

Another embodiment is directed to a switched capacitor circuit operable in a sampling phase and a transfer phase. The switched capacitor circuit comprises: a plurality of switches; a set of at least two capacitors; at least one voltage amplifier; and an operational amplifier. During the sampling phase, at least one input voltage is sampled, and during the transfer phase at least a first reference voltage provided by the at least one voltage amplifier is subtracted from the at least one input voltage using the operational amplifier, wherein the same set of at least two capacitors is used in both the sampling phase and the transfer phase.

Another embodiment is directed to a charge transfer method, comprising: A) sampling at least one input voltage during a sampling phase; and B) subtracting, using an operational amplifier, at least a first reference voltage from the at least one input voltage during a transfer phase, the first reference voltage being provided by at least one voltage amplifier, wherein the voltage gain of the at least one voltage amplifier is greater than one, wherein A) and B) are performed using a same set of at least two capacitors for both the sampling phase and the transfer phase.

Another embodiment is directed to a stage of a pipeline or algorithmic analog-to-digital converter. The stage comprises: a plurality of switches; at least one input capacitor; an integration capacitor; a first voltage amplifier to provide a first offset voltage on which a first reference voltage is based; a second voltage amplifier to provide a second offset voltage on which a second reference voltage is based; an M-bit flash analog-to-digital converter to control at least some of the plurality of switches during the transfer phase; and an operational amplifier. A number N of the at least one input capacitor is equal to $2^M-1$. During the sampling phase: 1) the plurality of switches are configured to couple a first input voltage to the at least one input capacitor and a second input voltage to the integration capacitor; and 2) the first input voltage is applied to an input of the M-bit flash ADC to provide an M-bit digital output code from the M-bit flash ADC based at least in part on the first input voltage. During the transfer phase: 1) the plurality of switches are configured to couple at least one of the at least one input capacitor, and to couple the integration capacitor and one of the first voltage amplifier and the second voltage amplifier, to the operational amplifier to subtract a fraction of a corresponding one of the first reference voltage and the second reference voltage from a sum voltage based on the first input voltage and the second input voltage so as to provide an output voltage from the operational amplifier, wherein the fraction is based at least in part on a digital value of the M-bit digital output code; and 2) the M-bit digital output code from the M-bit flash ADC controls at least some of the plurality of switches to select the one of the first voltage amplifier and the second voltage amplifier.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

DETAILED DESCRIPTION

The following discussion presents detailed descriptions of various concepts related to, and embodiments of, inventive apparatus and methods relating to switched capacitor circuits. It should be appreciated that various concepts introduced above and discussed in greater detail below may be implemented in any of numerous ways, as the disclosed concepts are not limited to any particular manner of implementation. Examples of specific implementations and applications are provided for illustrative purposes. Those skilled in the art will appreciate extensions and modifications of the present disclosure while remaining within the scope of the teachings of the present disclosure, all of which are meant to be comprehended by the appended claims.

FIG. 1 provides an illustration of a switched capacitor circuit 10 that includes an operational amplifier 22. The circuit 10 also includes two capacitors $C_1$ and $C_2$, and three switches $S_1$, $S_2$ and $S_3$. An analog input voltage $V_{IN}$ to be sampled (hereafter referred to as "input voltage") provides an input to the circuit 10, and a voltage $V_O$ (hereafter referred to as "output voltage") is provided as an output of the circuit 10. FIG. 1 also illustrates a system common-mode voltage $V_{CM}$ (e.g., ground) serving as a reference potential for the input voltage $V_{IN}$ and the output voltage $V_O$.

As would be appreciated by one of skill in the art, in the circuit of FIG. 1 the switches $S_1$, $S_2$ and $S_3$ are operable to operate the circuit in two phases, namely a "sampling phase" and a "transfer phase." For purposes of illustration, in FIG. 1 each of the switches is shown as a single-pole double-throw (SPDT) switch having a common terminal C and respective output terminals 1 and 2.

Figure 1A:
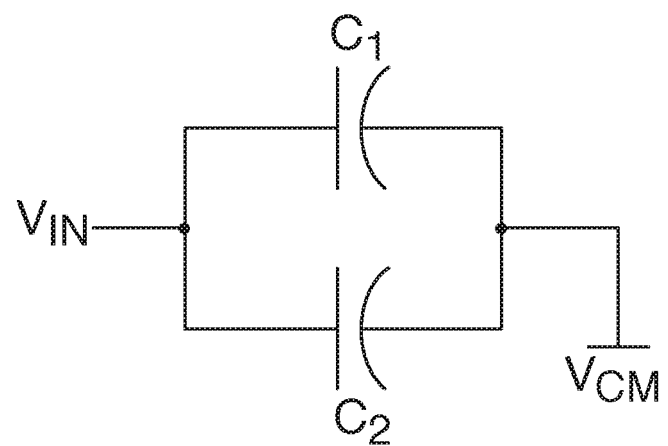
FIG. 1A illustrates the circuit of FIG. 1 redrawn without switches and showing the state of electrical connections during a sampling phase of circuit operation.
Figure 1B:
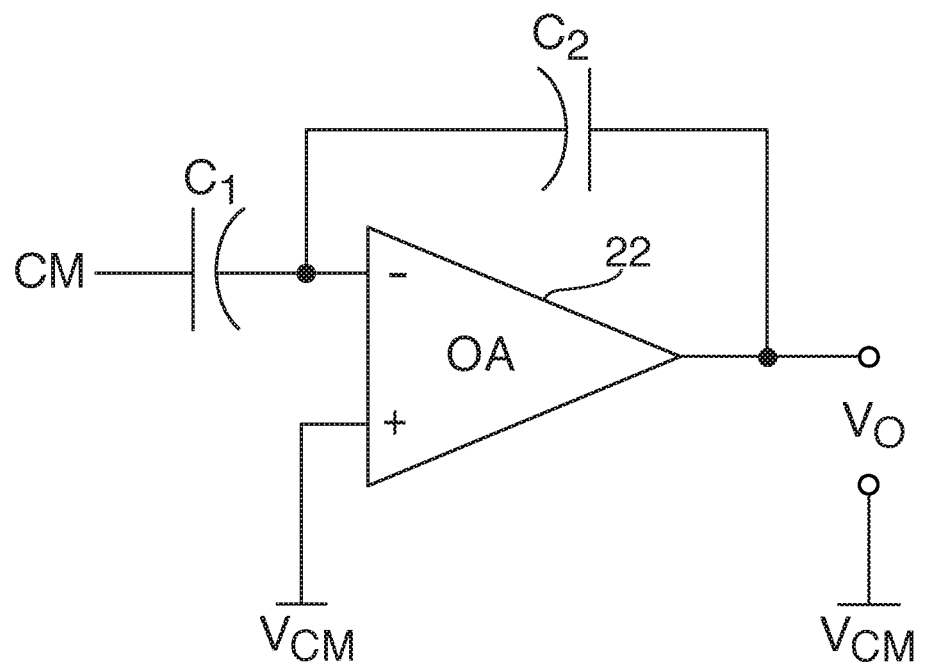
FIG. 1B illustrates the circuit of FIG. 1 redrawn without switches and showing the state of electrical connections during a transfer phase of circuit operation.

During the sampling phase, the switches are operated to be in the state shown in FIG. 1, i.e., the common terminal C of each switch is electrically coupled to terminal 1 of the switch. FIG. 1A illustrates the circuit of FIG. 1 redrawn without the switches $S_1$, $S_2$ and $S_3$ and showing the state of electrical connections during the sampling phase. As shown in FIG. 1A, the input voltage $V_{IN}$ is applied similarly across both capacitors $C_1$ and $C_2$ arranged in a parallel configuration. Thus, the total charge $Q_{total}$ stored during the sampling phase is given is $V_{IN}(C_1+C_2)$. During the transfer phase, the switches are operated such that the common terminal C of each switch is electrically coupled to terminal 2 of the switch. FIG. 1B illustrates the circuit of FIG. 1 redrawn without the switches $S_1$, $S_2$ and $S_3$ and showing the state of electrical connections during the transfer phase. Given the configuration of the capacitors $C_1$ and $C_2$ in the transfer phase, the capacitor $C_1$ is hereafter referred to as an "input capacitor," and the capacitor $C_2$ is hereafter referred to as an "integration capacitor." In the transfer phase, because there is no potential different across $C_1$, all of the charge is transferred to $C_2$, i.e., $Q_{total}=C_2*V_O$.

Assuming the operational amplifier 22 is ideal, and presuming that charge is conserved between the sampling phase and the transfer phase, the output voltage accordingly is given by:

$$V_O = (n+1)V_{IN} \quad (1)$$

where $n=C_2/C_1$. Thus, the input voltage is amplified by a fixed gain n+1, which is determined only by the ratio of capacitors. It should be appreciated that n may have a variety of values based on respective capacitance values of the capacitors $C_1$ and $C_2$. For example, if the respective capacitance values are substantially equal, a gain of essentially two is achieved; similarly, for a capacitance value of $C_2$ that is significantly greater than $C_1$, a gain that approaches substantially unity gain may be provided.

In practice, the operational amplifier 22 is not ideal and has limitations that impact the performance of the circuit 10 in terms of the speed, power consumption, accuracy, and noise of the circuit. If op amp 22 has finite DC gain, the output voltage is shown to be:

$$V_O = \frac{(n+1)}{1+\frac{n+1}{a_o}}V_{IN} \quad (2)$$

where $a_o$ is the DC gain of the op amp. The resulting fractional error in the output voltage is then $(n+1)/a_o$. For example, with $a_o=1,000$, and a closed-loop gain of n+1=10, the error is approximately 1%, which is significant and potentially excessive for some practical applications of the circuit 10. In this context, it should be noted that the higher the closed-loop gain n+1, the larger the error. Furthermore, increasing the DC gain $a_o$ of the op amp requires complex circuitry and results in increased power consumption and increased noise of the resulting circuit.

The maximum operating frequency of the circuit 10 also is limited by the op amp bandwidth. It can be shown that the closed loop −3 dB bandwidth of the circuit 10 in the transfer state shown in FIG. 1B is:

$$\omega_h = \frac{\omega_t}{n+1} \quad (3)$$

where $\omega_t$ is the gain-bandwidth product (unity-gain frequency) of the op amp. The higher the closed loop gain n+1, the lower the closed loop bandwidth. To achieve relatively high bandwidth (and thus high operational speed), the gain-bandwidth product of the op amp must be made high, which requires high power consumption.

In the circuit of FIG. 1, noise generated by the operational amplifier 22 is typically the dominant source of noise in the circuit 10, because the op amp is a complex circuit with many devices contributing noise. It can be shown that the noise $v_n$ in the circuit shown in FIG. 1B, referred to the input voltage $V_{IN}$, is the same as the op amp noise $v_{eq1}$ referred to its own input:

$$v_n \approx v_{eq1} \quad (4)$$

Since the noise of the op amp $v_{eq1}$ generally is relatively large, the corresponding circuit noise $v_n$ is also large. Reducing the op amp noise requires a considerable amount of power.

Figure 2:
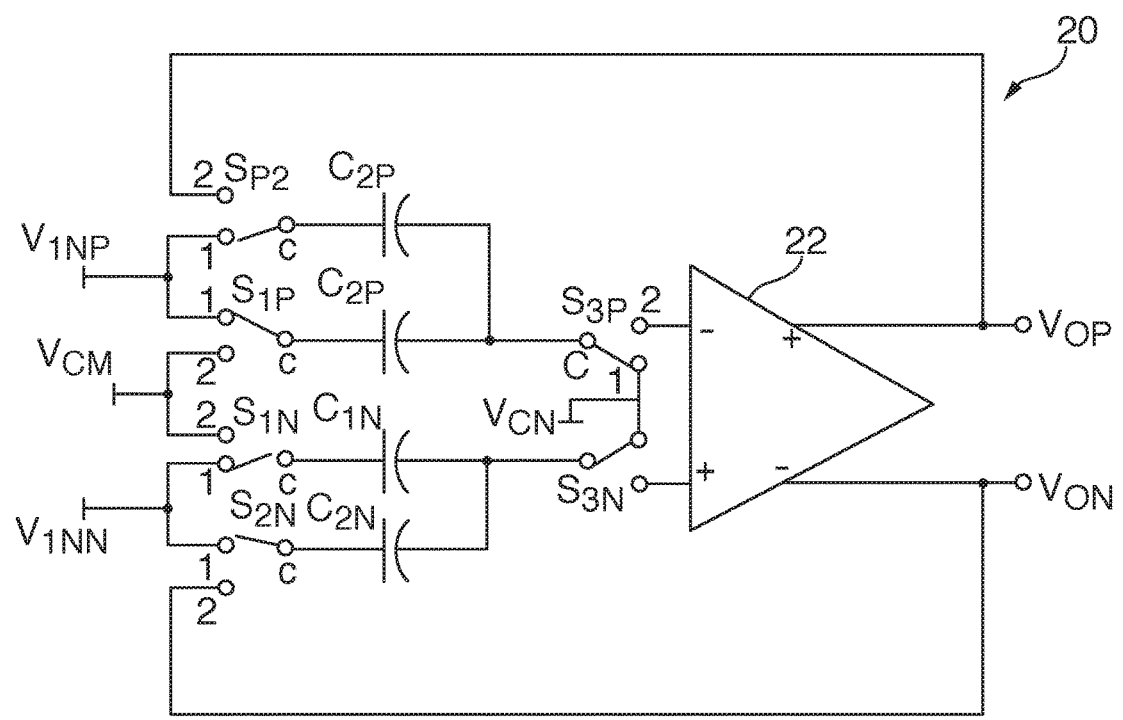
FIG. 2 illustrates an example of a differential switched capacitor circuit including a differential operational amplifier.

In a system-on-a-chip (SOC), differential implementation of switched capacitor circuits is often employed for a greater signal range and superior power supply and common-mode rejection. The circuit 20 in FIG. 2 is a differential version of the circuit shown in FIG. 1. During the sampling phase, the switches are operated to be in the state shown in FIG. 2, i.e., the common terminal C of each switch is electrically coupled to terminal 1 of the switch.

Figure 2A:
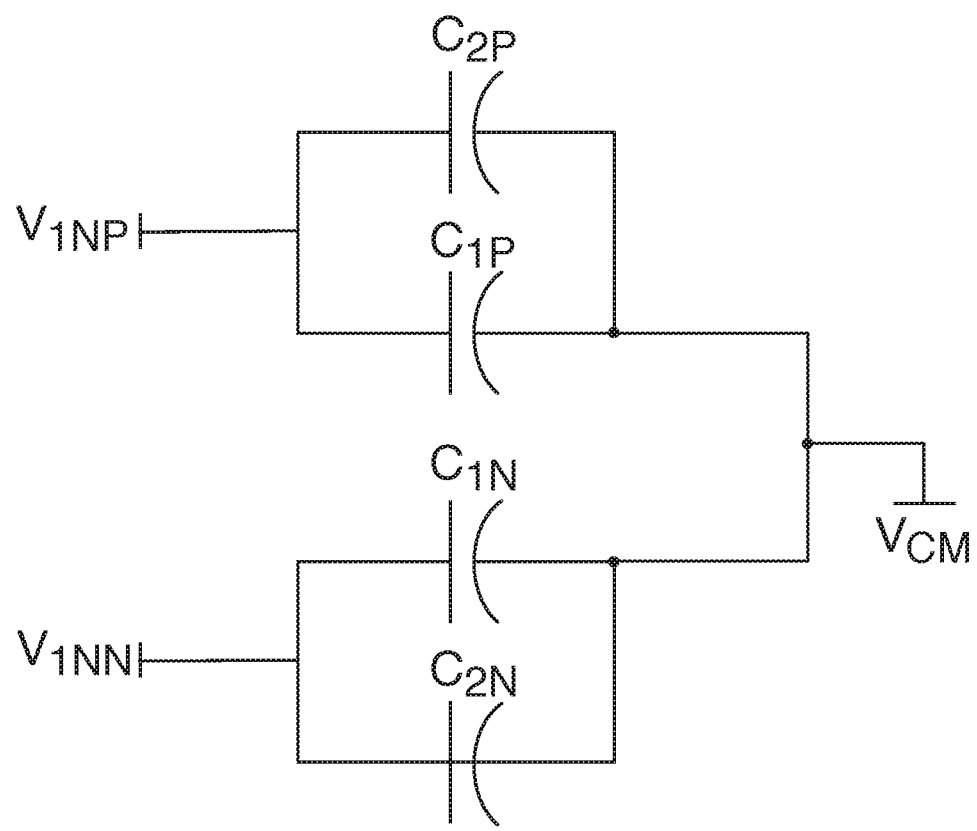
FIG. 2A illustrates the circuit of FIG. 2 redrawn without switches and showing the state of electrical connections during a sampling phase of circuit operation.

FIG. 2A illustrates the circuit of FIG. 2 redrawn without the switches $S_{1P}$, $S_{1N}$, $S_{2P}$, $S_{2N}$, $S_{3P}$, and $S_{3N}$ and showing the state of electrical connections during the sampling phase. As shown in FIG. 2A, the positive input voltage $V_{INP}$ is applied across both capacitors $C_{1P}$ and $C_{2P}$ arranged in a parallel configuration, and the negative input voltage $V_{INN}$ is applied similarly across both capacitors $C_{1N}$ and $C_{2N}$ arranged in a parallel configuration. The value of each of $C_{1P}$ and $C_{1N}$ is nominally equal to $C_1$, and the value of each of $C_{2P}$ and $C_{2N}$ is nominally equal at $C_2$. During the transfer phase, the switches are operated such that the common terminal C of each switch is electrically coupled to terminal 2 of the switch.

Figure 2B:
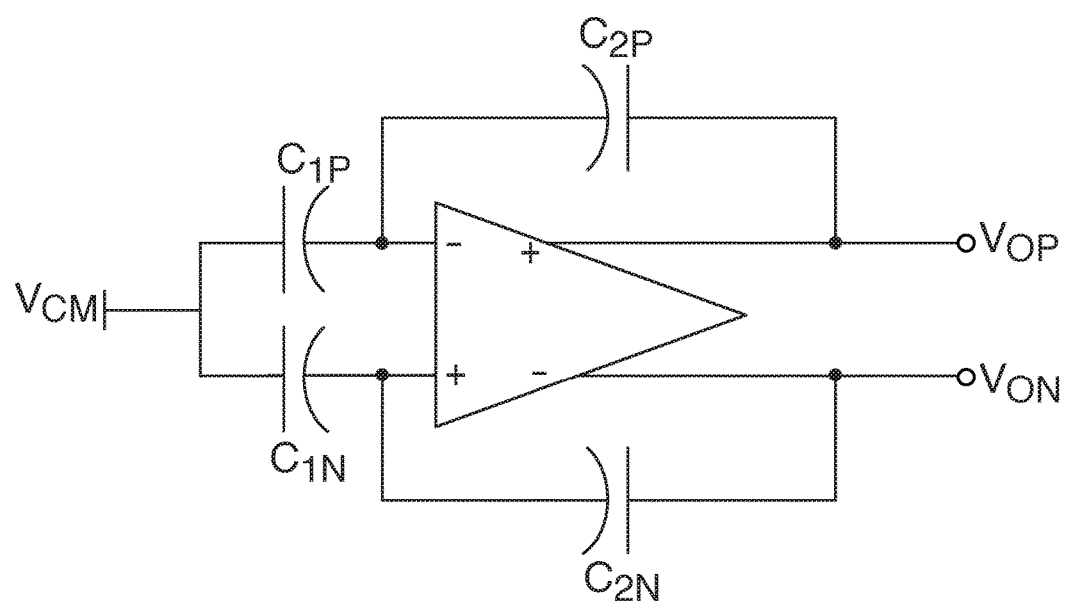
FIG. 2B illustrates the circuit of FIG. 2 redrawn without switches and showing the state of electrical connections during a transfer phase of circuit operation.

FIG. 2B illustrates the circuit of FIG. 2 redrawn without the switches $S_{1P}$, $S_{1N}$, $S_{2P}$, $S_{2N}$, $S_{3P}$, and $S_{3N}$ and showing the state of electrical connections during the transfer phase. It can be shown that the differential circuit in FIG. 2 is functionally identical to the circuit in FIG. 1, if the input voltages $V_{IN}$ is defined as the difference between the two input voltages $V_{INP}$ and $V_{INN}$, and the differential output voltage $V_O$ as the difference between the two output voltages $V_{OP}$ and $V_{ON}$.

In view of the foregoing, various inventive embodiments disclosed herein generally relate to differential switched capacitor circuits having one or more voltage amplifiers and an operational amplifier, in which the voltage amplifier(s) mitigate at least some of the limitations imposed on the switched capacitor circuit by the operational amplifier.

Figure 3:
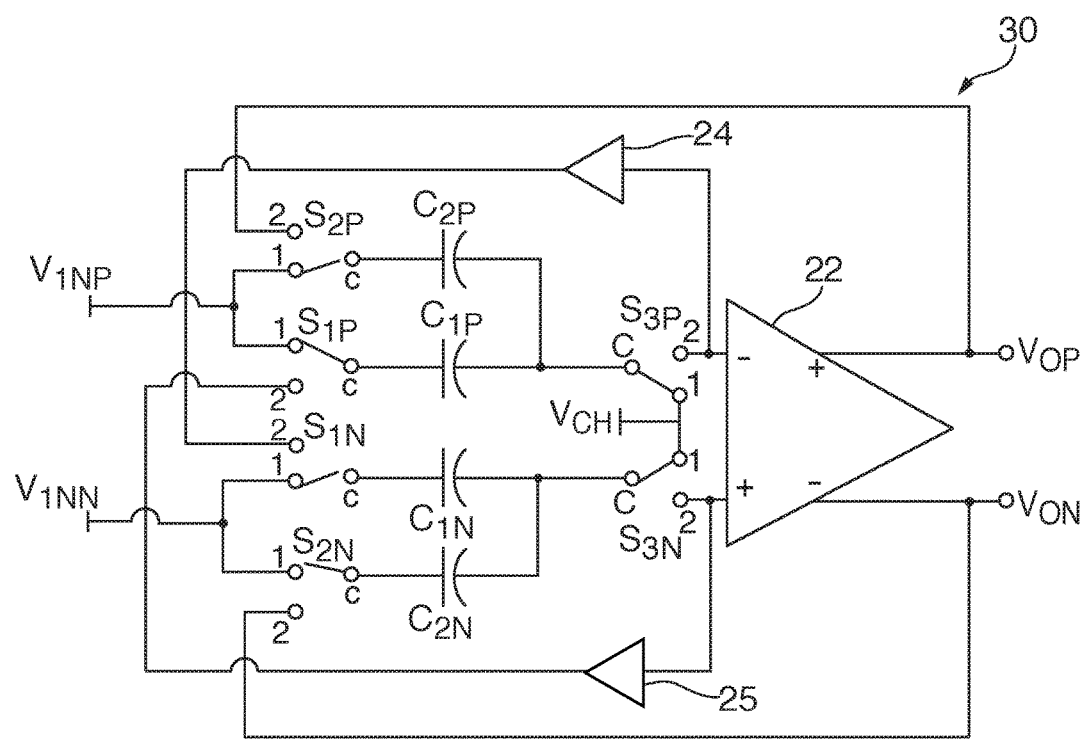
FIG. 3 illustrates and example of a differential switched capacitor circuit including inverting amplifiers according to one embodiment of the present invention.

FIG. 3 illustrates an example of a switched capacitor circuit 30 including a voltage amplifier (VA) 24 and another voltage amplifier 25, according to one embodiment of the present invention. In this embodiment, both voltage amplifiers 24 and 25 are shown as inverting amplifiers (IA). The circuit is operated similarly to that shown in FIG. 2, namely, in which the switches $S_{1P}$, $S_{1N}$, $S_{2P}$, $S_{2N}$, $S_{3P}$, and $S_{3N}$ are operated so as to configure the circuit 30 in a sampling phase and in a transfer phase, respectively. During the sampling phase of FIG. 3, the circuit 30 is electronically configured as shown in FIG. 2A, i.e., the positive input voltage $V_{INP}$ is applied across both capacitors $C_{1P}$ and $C_{2P}$ arranged in a parallel configuration, and the negative input voltage $V_{INN}$ is applied similarly across both capacitors $C_{1N}$ and $C_{2N}$ arranged in a parallel configuration. However, unlike the circuit 20 shown in FIG. 2, during the transfer phase in the circuit 30 of FIG. 3 the switches are operated so as to place the circuit 30 in the configuration shown in FIG. 3A, in which the amplifier 24 is coupled to the capacitor $C_{1N}$, and the amplifier 25 is coupled to the capacitor $C_{1P}$. More specifically, in FIG. 3A the capacitor $C_{1N}$ is driven by the output of the amplifier 24 having an input coupled to the inverting input of the operational amplifier 22, rather than having the capacitor $C_{1N}$ coupled to $V_{CM}$ as shown in FIG. 2B. Similarly, the capacitor $C_{1P}$ is driven by the output of the amplifier 25 having an input coupled to the non-inverting input of the operational amplifier 22, rather than having the capacitor $C_{1P}$ coupled to $V_{CM}$ as shown in FIG. 2B. Presuming the amplifiers 24 and 25 both have a voltage gain of $-(1+k)$, the differential output voltage $V_O$ of the circuit 30, defined as the difference between $V_{OP}$ and $V_{ON}$, is given as:

$$V_O = \frac{(n+1)}{1 + \frac{1-nk}{a_0}} V_{IN} \quad (5)$$

where the differential input voltage $V_{IN}=V_{INP}-V_{INN}$ and $n=C_1/C_2$.

It can be seen from Equation (5) that if k=0 (corresponding to the amplifier gain of −1), The fractional error is reduced to $1/a_o$, which is lower by a factor of (n+1) compared with Equation (2) for the circuit in FIG. 2.

For the circuit 30 of FIG. 3, with k=0, it can be shown that the bandwidth of the circuit is given by:

$$\omega_h \approx \omega_1 \quad (6)$$

Compared with the bandwidth given in Equation (3) for the circuit in FIG. 1, the bandwidth is improved significantly by the factor of 1+n.

Figure 3A:
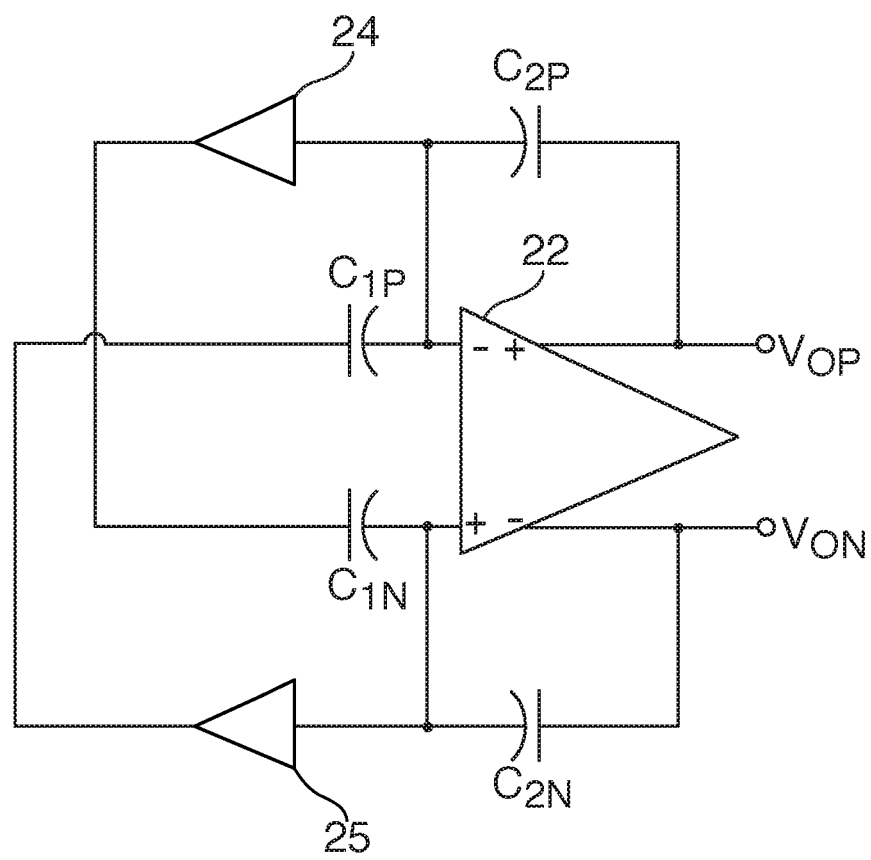
FIG. 3A illustrative the circuit of FIG. 3 redrawn without switches and showing the state of electrical connections during a transfer phase of circuit operation.

In the circuit 30 of FIG. 3, the noise effect of the operational amplifier 22 is also significantly improved compared with the circuit 20 shown in FIG. 2. In particular, it can be shown that the input referred noise of the circuit during the transfer phase shown in FIG. 3A is:

$$v_n \approx v_{eq1} \frac{1}{1+n} \quad (7)$$

Compared with the input referred noise given in Equation (4) for the circuit in FIG. 2, the noise is improved by a factor of 1+n.

In sum, the circuit 30 of FIG. 3 improves three key performance parameters, namely, the bandwidth, and noise by the same factor, i.e., (1+n) if the gain G of the voltage amplifiers is substantially equal to −1. Moreover, it is advantageous for the amplifiers to provide voltage gain G of the value −(1+1/n) rather than −1 to eliminate the error due to the finite gain of the operational amplifier.

If the gain of the amplifier is increased such that k=1/n, the fractional error in Equation (5) reduces to zero. Thus, by making the gain G of the amplifiers substantially equal to −(1+1/n), the error due to the finite gain of the operational amplifier 22 can be mitigated.

The noise effect from the operational amplifier also disappears. However, the stability of the system can be compromised. The stability problem can be mitigated by placing a zero in a strategic place in the system.

In practice, parasitic capacitance $C_{PP}$ and $C_{PN}$, present at the inverting and the non-inverting inputs of the operational amplifier, respectively, may significantly degrade the performance of the circuits in FIG. 2 and FIG. 3. Their values are typically equal and given by $C_P$. Such parasitic capacitance arises from the input capacitance of the operational amplifier 22 and the routing capacitance. In the circuit 30 shown in FIG. 3, input capacitance of the amplifiers 24 and 25 also contributes to the parasitic capacitance. For the circuit 20 in FIG. 2, it can be shown that the output voltage is given by:

$$V_O = \frac{(n+1)}{1 + \frac{1+n+m}{a_0}} V_{IN} \quad (8)$$

where $m=C_P/C_2$.

The bandwidth degrades as a result of the parasitic capacitance;

$$\omega_h = \frac{\omega_1}{n+m+1} \quad (9)$$

and the input referred noise also increases to;

$$v_n = \frac{n+m+1}{n+1} v_{eq1} \quad (10)$$

For the circuit 30 in FIG. 3, with the inclusion of the parasitic capacitance, the differential output voltage is given by:

$$V_O = \frac{(n+1)}{1 + \frac{1+m-kn}{a_0}} V_{IN} \quad (11)$$

As is evident from Equation (11), by making $k=m/n=C_P/C_1$, the fractional error is reduced to $1/a_o$, which is the same level as in the circuit without parasitic capacitance with k=0. The corresponding magnitude G of the voltage amplifier gain is $$G = 1 + k = \frac{C_1 + C_P}{C_1} \quad (12)$$

In this case, it can be shown that effect of the operational amplifier noise as well as the bandwidth are the same as in Equations (6) and (7).

In certain implementations, it may be advantageous to make the magnitude of the gain of the voltage amplifier greater than the gain in Equation (12). In particular, if the gain of the amplifiers is increased such that $k=(1+m)/n=(C_2+C_P)/C_1$, the fractional error due to the finite gain of the operational amplifier 22 is reduced to zero even in the presence of parasitic capacitance. The corresponding magnitude G of the voltage gain of the voltage amplifier is given by $$G = 1 + k = \frac{C_1 + C_2 + C_P}{C_1} \quad (13)$$

The noise effect from the operational amplifier also disappears. However, the stability of the system can be compromised. The stability problem can be mitigated by placing a zero in a strategic place in the system.

Figure 4:
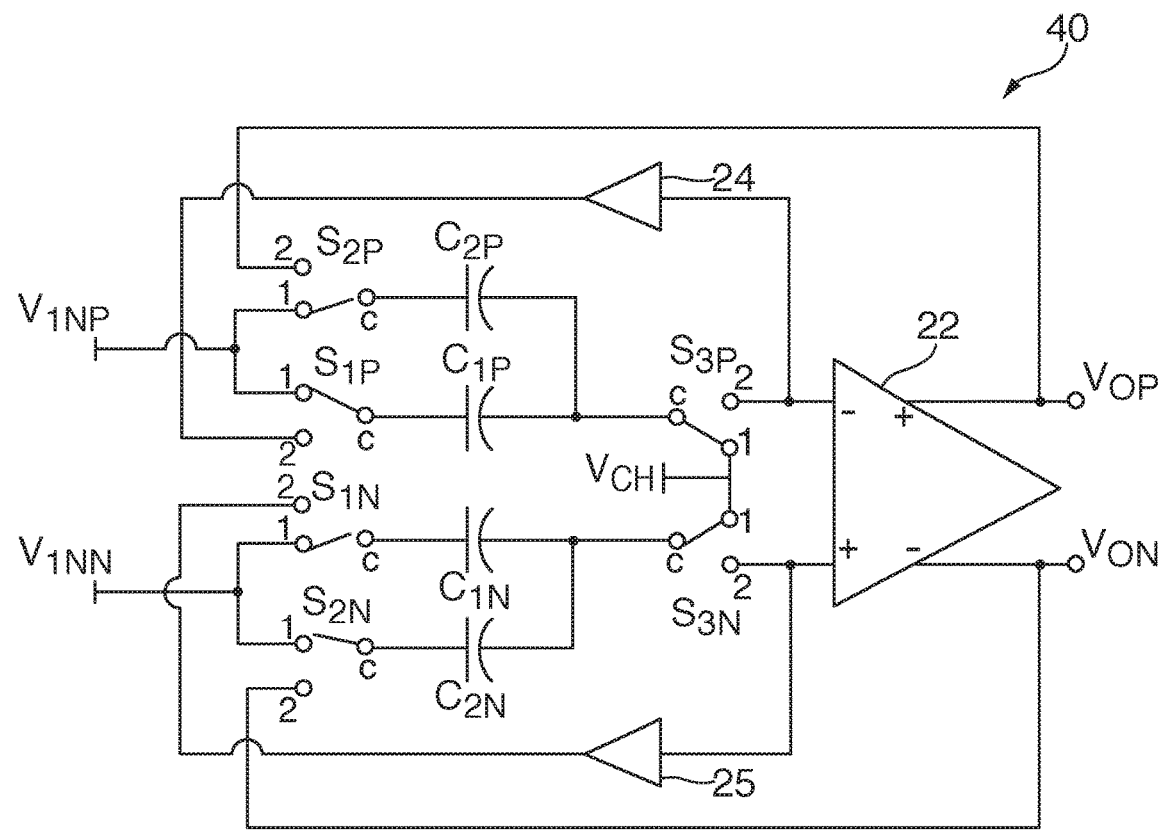
FIG. 4 illustrates an example of a differential switched capacitor circuit including a non-inverting amplifier, according to another embodiment of the present invention.

In FIG. 4, another embodiment of the present invention is shown. In this embodiment, both voltage amplifiers 24 and 25 are shown as non-inverting amplifiers (NIA). The circuit 40 is operated similarly to that shown in FIG. 3, namely, in which the switches $S_{1P}$, $S_{1N}$, $S_{2P}$, $S_{2N}$, $S_{3P}$, and $S_{3N}$ are operated so as to configure the circuit 40 in a sampling phase and in a transfer phase, respectively. During the sampling phase of FIG. 4, the circuit 40 is electronically configured as shown in FIG. 2A, i.e., the positive input voltage $V_{INP}$ is applied across both capacitors $C_{1P}$ and $C_{2P}$ arranged in a parallel configuration, and the negative input voltage $V_{INN}$ is applied similarly across both capacitors $C_{1N}$ and $C_{2N}$ arranged in a parallel configuration. However, unlike the circuit 20 shown in FIG. 2, during the transfer phase in the circuit 40 of FIG. 4 the switches are operated so as to place the circuit 40 in the configuration shown in FIG. 4A, in which the amplifier 24 is coupled to the capacitor $C_{1P}$, and the amplifier 25 is coupled to the capacitor $C_{1N}$. More specifically, in FIG. 4A the capacitor $C_{1P}$ is driven by the output of the amplifier 24 having an input coupled to the inverting input of the operational amplifier 22. Similarly, the capacitor $C_{1N}$ is driven by the output of the amplifier 25 having an input coupled to the non-inverting input of the operational amplifier 22. Presuming the amplifiers 24 and 25 both have a voltage gain of (1+k), the differential output voltage $V_O$ of the circuit 40 is given by:

$$V_O = \frac{(n+1)}{1 + \frac{1-nk}{a_o}} V_{IN} \quad (14)$$

where $n=C_1/C_2$.

It can be seen from Equation (14) that if k=0 (corresponding to the amplifier gain G of 1), The fractional error is reduced to $1/a_o$, which is lower by a factor of (n+1) compared with the circuit 20 in FIG. 2.

For the circuit 40 of FIG. 4, with k=0, it can be shown that the bandwidth of the circuit is given by:

$$\omega_h \approx \omega_1 \quad (15)$$

Compared with the bandwidth given in Equation (3) for the circuit in FIG. 1, the bandwidth is improved significantly by the factor of 1+n.

Figure 4A:
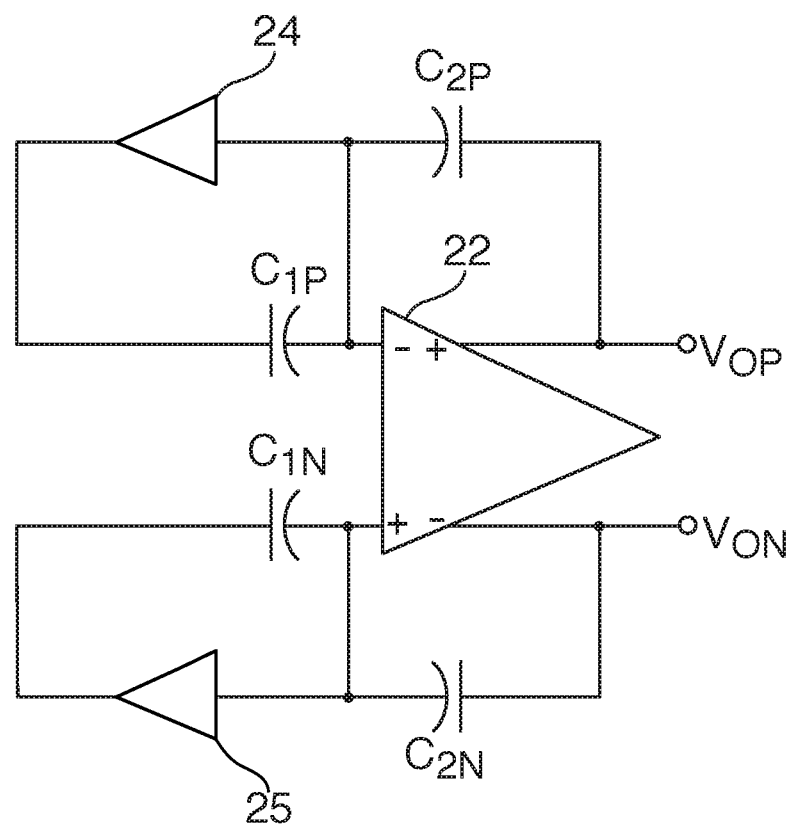
FIG. 4A illustrates the circuit of FIG. 4 redrawn without switches and showing the state of electrical connections during a transfer phase of circuit operation.

In the circuit 40 of FIG. 4, the noise effect of the operational amplifier 22 is also significantly improved compared with the circuit 20 shown in FIG. 2. In particular, it can be shown that the input referred noise of the circuit 40 during the transfer phase shown in FIG. 4A is $$v_n \approx v_{eq1} \frac{1}{1+n} \quad (16)$$

Compared with the input referred noise given in Equation (4) for the circuit in FIG. 1, the noise is improved by the factor of 1+n.

In sum, the circuit 40 of FIG. 4 improves three key performance parameters, namely, the bandwidth, and noise by the same factor, i.e., (1+n) if the gain of the voltage amplifiers is substantially equal to 1. Moreover, it is advantageous for the amplifiers to provide voltage gain G of the value (1+1/n) rather than 1 to eliminate the error due to the finite gain of the operational amplifier.

If the gain of the amplifier is increased such that k=1/n, the fractional error in Equation (14) reduces to zero. Thus, by making the gain of the amplifiers substantially equal to (1+1/n), the error due to the finite gain of the operational amplifier 22 can be mitigated. The noise effect from the operational amplifier also disappears. However, the stability of the system can be compromised. The stability problem can be mitigated by placing a zero in a strategic place in the system.

In practice, parasitic capacitance $C_{PP}$ and $C_{PN}$, present at the inverting and the non-inverting inputs of the operational amplifier, respectively, may significantly degrade the performance of the circuit in FIG. 4. Their values are typically equal and given by $C_P$. Such parasitic capacitance arises from the input capacitance of the operational amplifier 22, the routing capacitance, and the input capacitance of the amplifiers 24 and 25. For the circuit 40 in FIG. 4, with the inclusion of the parasitic capacitance, the differential output voltage is given by $$V_O = \frac{(n+1)}{1 + \frac{1+m-kn}{a_0}} V_{IN} \quad (17)$$

As is evident from Equation (17), by making $k=m/n=C_P/C_1$, the fractional error is reduced to $1/a_o$, which is the same level as in the circuit without parasitic capacitance with k=0. The corresponding magnitude G of the voltage amplifier gain is $$G = 1 + k = \frac{C_1 + C_P}{C_1} \quad (18)$$

It can be shown that effect of the operational amplifier noise as well as the bandwidth are the same as in Equations (6) and (7).

In certain implementations, it may be advantageous to make the magnitude of the gain of the voltage amplifier greater than the gain in Equation (18). In particular, if the gain of the amplifiers is increased such that $k=(1+m)/n=(C_2+C_P)/C_1=(C_2+C_P)/C_1$, the fractional error due to the finite gain of the operational amplifier 22 is reduced to zero even in the presence of parasitic capacitance. The corresponding magnitude of the voltage gain of the voltage amplifier is given by $$G = 1 + k = \frac{C_1 + C_2 + C_P}{C_1} \quad (19)$$

The noise effect from the operational amplifier also disappears. However, the stability of the system can be compromised. The stability problem can be mitigated by placing a zero in a strategic place in the system.

The amplifiers 24 and 25 of the respective circuits 30, 40 shown in FIG. 3 (and FIG. 3A) and FIG. 4 (and FIG. 4A) may be implemented in a variety of manners according to different embodiments.

Figure 5A:
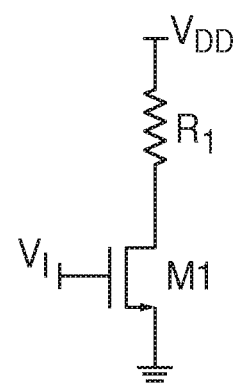
FIG. 5A illustrates an example of an inverting voltage amplifier implemented with an NMOS transistor and a resistor load according to an embodiment of the present invention.
Figure 5B:
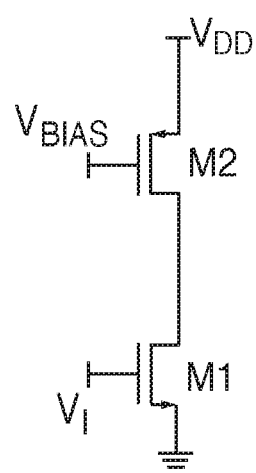
FIG. 5B illustrates another example of an inverting voltage amplifier implemented with an NMOS transistor and a PMOS transistor load according to another embodiment of the present invention.

In one implementation, the amplifiers 24 and 25 may be implemented using an operational amplifier (different from the op amp 22) in an inverting amplifier or a non-inverting amplifier configuration. Another implementation of the amplifiers 24 and 25 is shown in FIG. 5A, in which the amplifier is implemented as a common-source amplifier comprising a MOS transistor $M_1$ and a load resistor $R_1$. Since a common-source amplifier is an inverting amplifier, such an amplifier is used in the embodiment shown in FIG. 3 (and FIG. 3A). The load resistor $R_1$ may be implemented by a resistor, a MOS transistor, or a combination of both. FIG. 5B shows another implementation of the amplifiers 24 and 25 comprising an input transistor $M_1$ and a load transistor $M_2$. The control voltage $V_{BIAS}$ is used to adjust the regions of operation for $M_1$ and $M_2$, and control the DC quiescent output voltage and the gain of the inverting amplifier. For example, increasing $V_{BIAS}$ toward the power supply $V_{DD}$ keeps $M_2$ in saturation while driving $M_1$ to the triode region. The result is lower DC quiescent output voltage and lower gain. As $V_{BIAS}$ is lowered toward ground, both $M_1$ and $M_2$ are operated in saturation, the DC quiescent output voltage becomes higher, while the gain increases. Further reduction of $V_{BIAS}$ toward ground results in $M_1$ in the triode and $M_2$ in the saturation, providing yet higher DC quiescent output voltage and lower gain. Therefore, by employing the implementation of the inverting amplifier shown in FIG. 5B both the DC quiescent output voltage and the gain can be adjusted, which may be advantageous in certain applications.

Figure 5C:
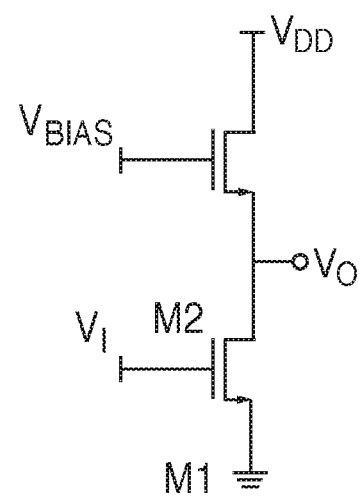
FIG. 5C illustrates another example of an inverting voltage amplifier implemented with an NMOS transistor and an NMOS transistor load according to another embodiment of the present invention.

FIG. 5C shows another embodiment of the amplifier 24 with an input NMOS transistor $M_1$ and a load transistor $M_2$. The gain of the amplifier is determined by the ratio of transconductance between the input and the load transistors. The offset voltage between the input and the output is adjustable by the control voltage $V_{BIAS}$.

Figure 6:
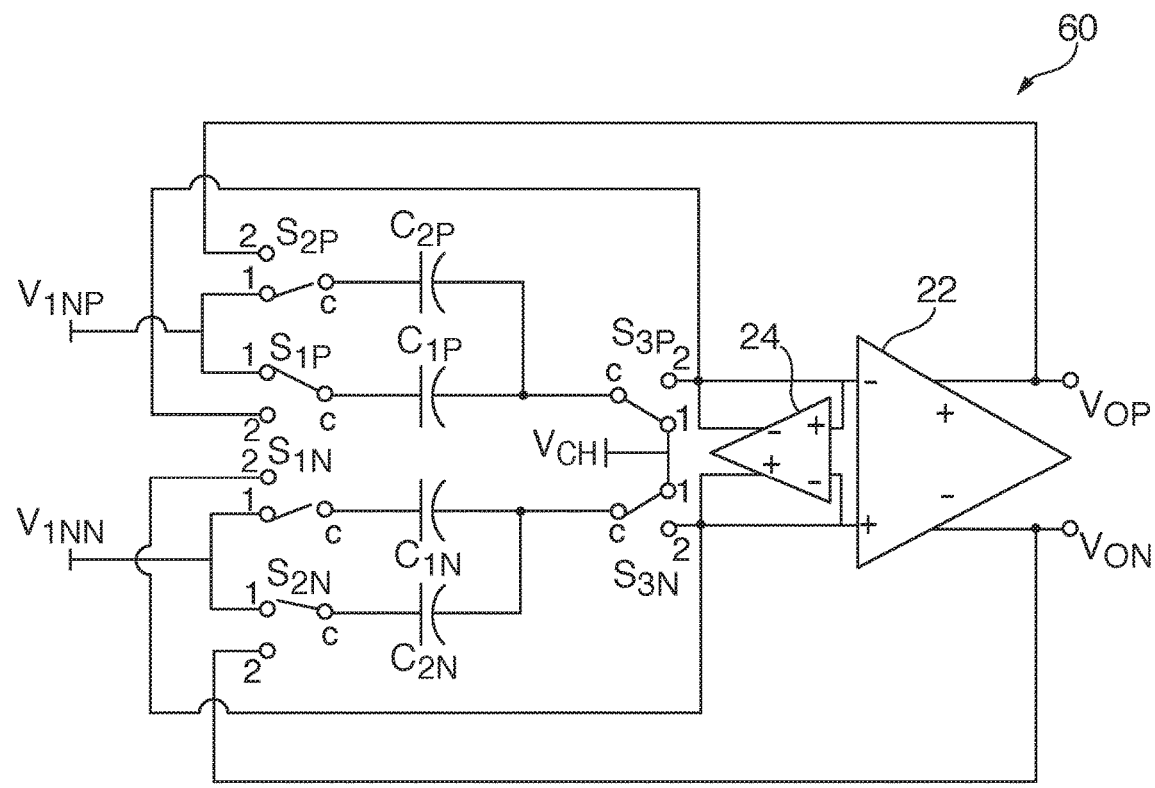
FIG. 6 illustrates another embodiment of the invention, in which the voltage amplifiers are implemented as a single differential amplifier.
Figure 6A:
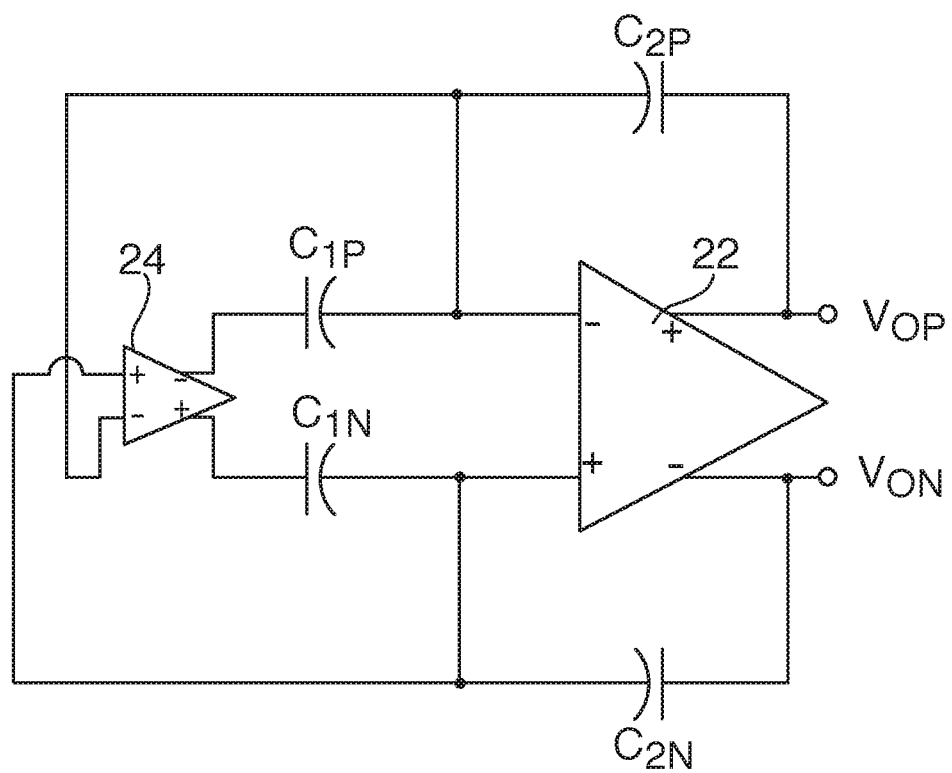
FIG. 6A illustrates the circuit of FIG. 6 redrawn without switches and showing the state of electrical connections during a transfer phase of circuit operation.

In some instances, it may be advantageous to employ a single differential amplifier shown in FIG. 6 instead of two separate voltage amplifiers as shown in FIG. 3 and FIG. 4. The amplifier 24 in circuit 60 illustrated in FIG. 6 has an inverting input $v_{IN}+$ and a non-inverting input $v_{IN}-$, and an inverting output $v_O-$ and a non-inverting output $v_O+$. The differential gain $a_{vd}$ is defined as the ratio between the differential output $v_O+-v_O-$ and the differential input $v_{IN}+-v_{IN}-$. As with the circuit in FIG. 3 and FIG. 4, the differential gain $a_{vd}$ is preferably substantially equal to (1+k) or where k=m/n or k=(1+m)/n. FIG. 6A shows the electrical connection during the transfer phase.

FIGS. 7A-7E show various implementations of the differential amplifier 24 in FIG. 6. In the circuit shown in FIG. 7A, the amplifier 24 comprises two input NMOS transistors $M_1$ and $M_2$, and two load resistors $R_1$ and $R_2$. The current source $I_{SS}$ biases the amplifier. The differential gain of the amplifier is determined by the transconductance $g_m$ of the input transistors and the value R of the load resistors;

$$a_{vd} = g_m R \quad (20)$$

Figure 7A:
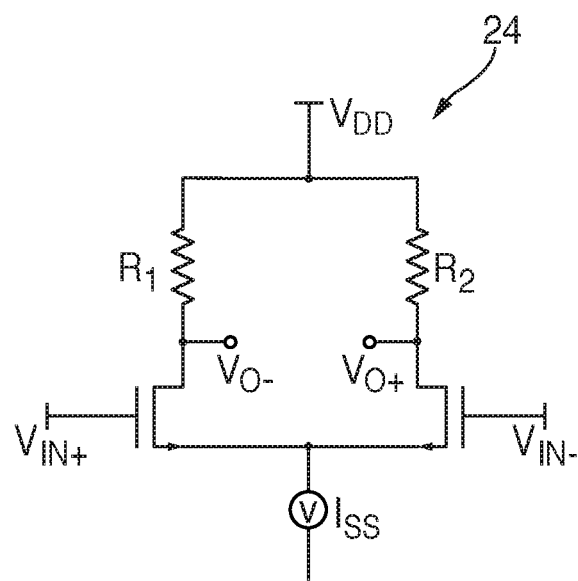
FIG. 7A illustrates an example of a differential voltage amplifier implemented with a pair of matched NMOS input transistors and a pair of load resistors according to an embodiment of the present invention.
Figure 7B:
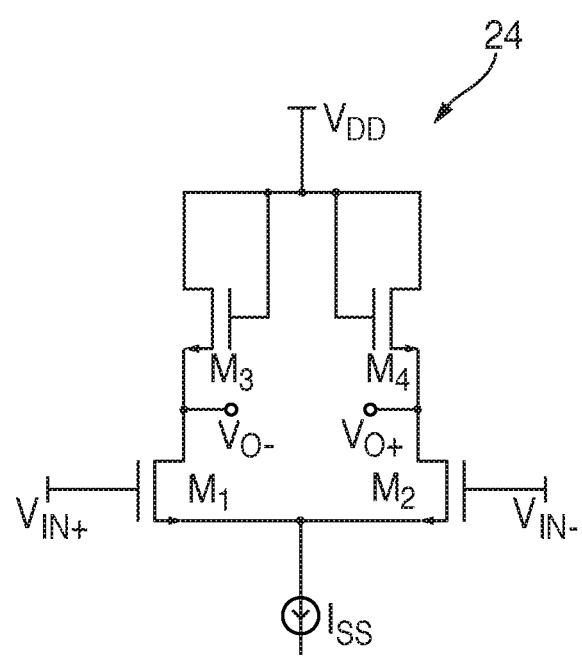
FIG. 7B illustrates another example of a differential voltage amplifier implemented with a pair of matched NMOS input transistors and another pair of NMOS load transistors according to another embodiment of the present invention.

In the circuit shown in FIG. 7B, the amplifier 24 comprises two input NMOS transistors $M_1$ and $M_2$, and two load transistors $M_3$ and $M_4$. The current source $I_{SS}$ biases the amplifier. The gain of the amplifier is determined by the ratio of transconductance between the input and the load transistors.

Figure 7C:
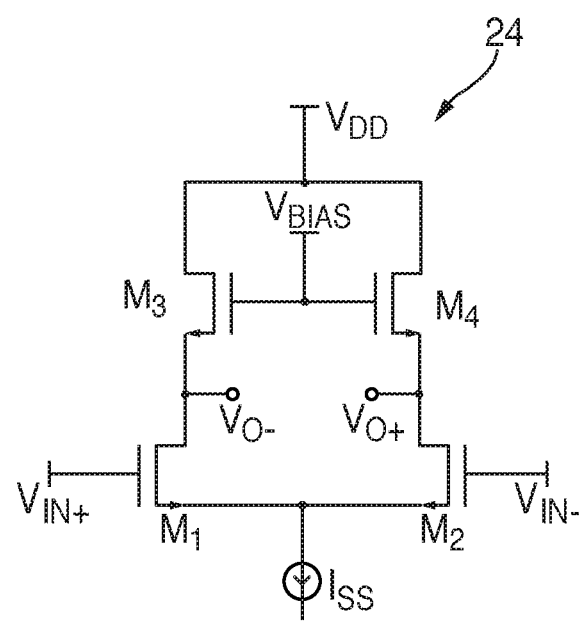
FIG. 7C illustrates another example of a differential voltage amplifier implemented with a pair of matched NMOS input transistors and another pair of NMOS load transistors with a control voltage to provide a controllable offset according to another embodiment of the present invention.

FIG. 7C shows another embodiment of the differential amplifier 24 with two input NMOS transistors $M_1$ and $M_2$, and two load transistors $M_3$ and $M_4$. The current source $I_{SS}$ biases the amplifier. The gain of the amplifier is determined by the ratio of transconductance between the input and the load transistors. The offset voltage between the input and the output is adjustable by the control voltage $V_{BIAS}$.

Figure 7D:
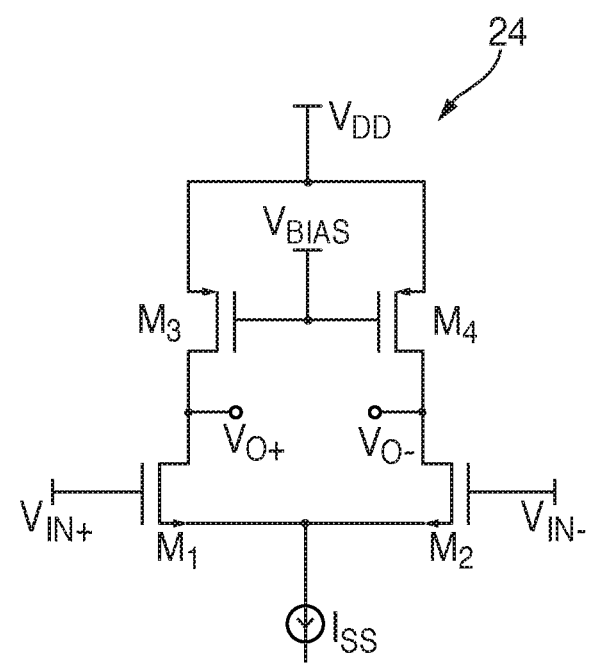
FIG. 7D illustrates another example of a differential voltage amplifier implemented with a pair of matched NMOS input transistors and a pair of PMOS load transistors with a control voltage to provide a controllable offset according to another embodiment of the present invention.

FIG. 7D shows yet another embodiment of the differential amplifier 24 with two input NMOS transistors $M_1$ and $M_2$, and two PMOS load transistors $M_3$ and $M_4$. The current source $I_{SS}$ biases the amplifier. The control voltage $V_{BIAS}$ is used to adjust the regions of operation for the transistors, and control the DC quiescent output voltage and the gain of the amplifier. For example, adjusting $V_{BIAS}$ toward the power supply $V_{DD}$ keeps $M_1$ and $M_2$ in saturation while driving $M_3$ and $M_4$ to the triode region. The result is lower DC quiescent output voltage and lower gain. As $V_{BIAS}$ is lowered toward ground, all transistors $M_1$-$M_4$ are operated in saturation, the DC quiescent output voltage becomes higher, while the gain increases. Further reduction of $V_{BIAS}$ toward ground results in $M_1$ and $M_2$ in the triode and $M_3$ and $M_4$ in the saturation, providing yet higher DC quiescent output voltage and lower gain. Therefore, by employing the implementation of the differential amplifier shown in FIG. 7D, both the DC quiescent output voltage and the gain can be adjusted, which may be advantageous in certain applications.

Figure 7E:
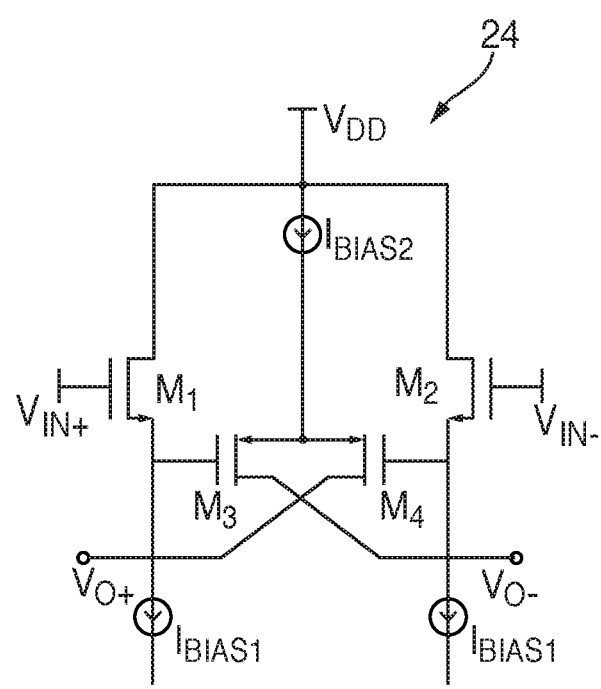
FIG. 7E illustrates an example of a differential non-inverting voltage amplifier implemented with a pair of NMOS source-follower amplifiers and a pair of PMOS transistors to provide positive feedback for higher voltage gain.

FIG. 7E shows yet another embodiment of the differential amplifier 24 with a first source follower circuit comprising $M_1$ and a first current source with a value $I_{BIAS1}$, and a second source follower circuit comprising $M_2$ and a second current source with the same value $I_{BIAS1}$. A source follower is a buffer circuit and is incapable of providing a voltage gain. In this embodiment, the differential pair comprising $M_3$, $M_4$, and the third current source with a value $I_{BIAS2}$ provide positive feedback thereby increasing the differential gain above unity as preferred in the present invention. The differential gain can be adjusted to the desired value, for example, the value given in Equation (19) by controlling $I_{BIAS2}$, which controls the amount of the positive feedback.

Figure 8:
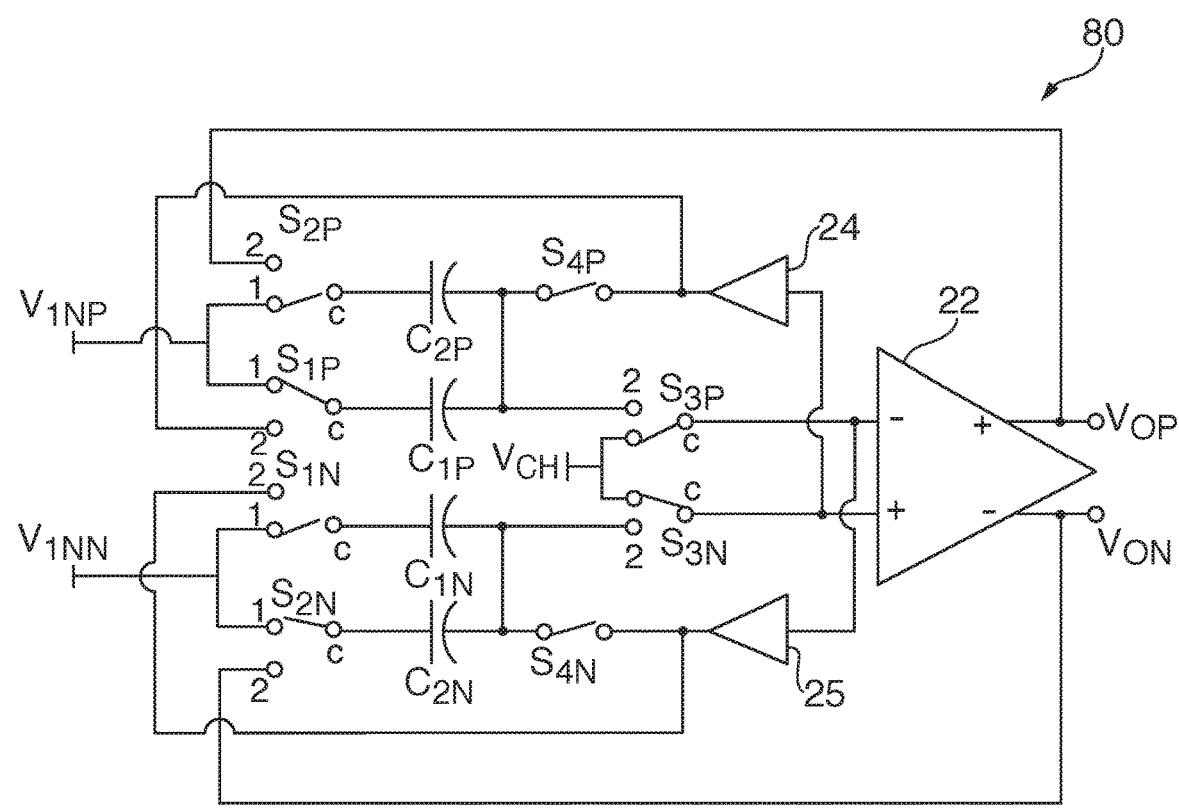
FIG. 8 illustrates the sampling phase of a switched capacitor circuit according to another embodiment, in which the voltage amplifiers included in the respective circuit configurations of both the sampling phase and the transfer phase.
Figure 8A:
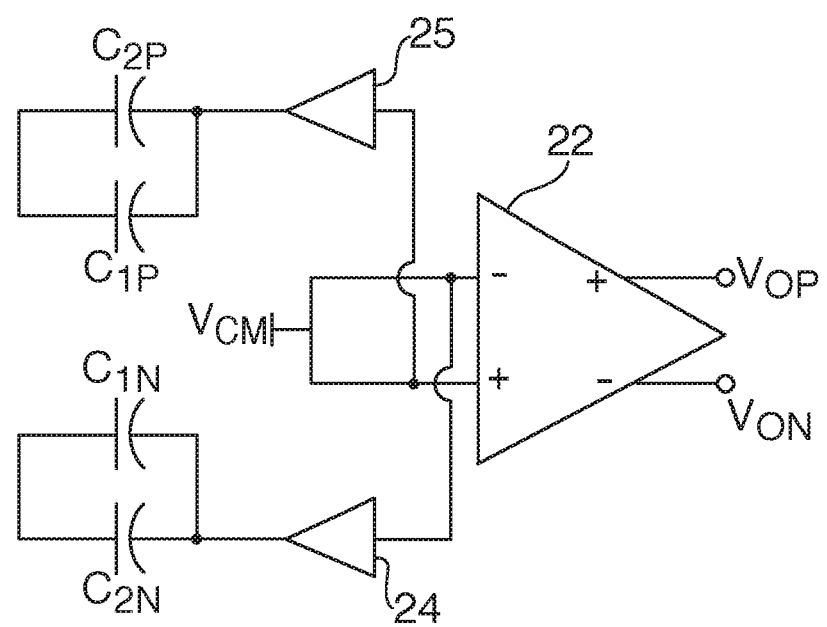
FIG. 8A illustrates the circuit of FIG. 8 redrawn without switches and showing the state of electrical connections during a sampling phase of circuit operation.
Figure 8B:
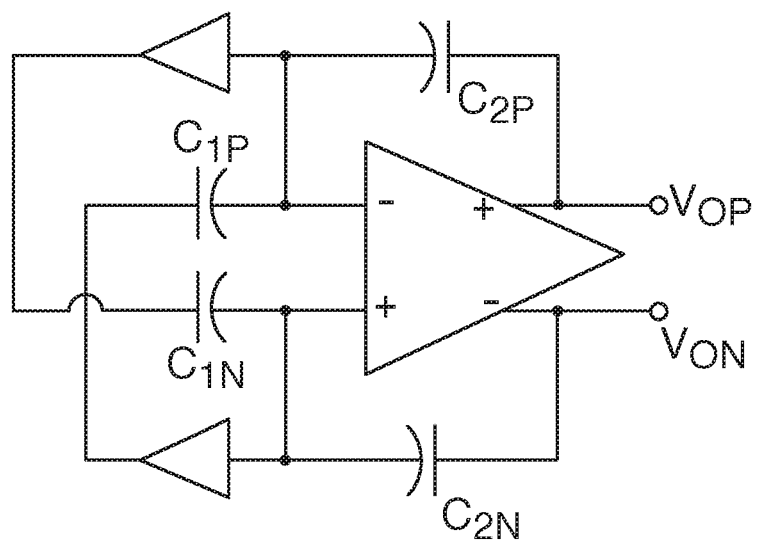
FIG. 8B illustrates the circuit of FIG. 8 redrawn without switches and showing the state of electrical connections during a transfer phase of circuit operation.

The voltage amplifiers shown in FIGS. 4, 5, 6 and 7 may in some cases have an appreciable DC offset between its input and the output voltages (an "offset voltage" of the voltage amplifier). As discussed further below, in some embodiments an amplifier's offset voltage may be advantageously employed in some analog-to-digital converter (ADC) configurations to intentionally provide a reference voltage that is subtracted from the input voltage $V_{IN}$ so as to provide an output voltage $V_O$ from a switched capacitor circuit for further processing in the ADC. However, in other implementations involving switched capacitor circuits, this offset of the voltage amplifiers may in turn give rise to an undesirable error in the output voltage $V_O$ of the circuit (e.g., circuits 20, 30, 40, and/or 60) as provided during the transfer phase. Accordingly, in another embodiment, a potential output voltage error arising from voltage amplifiers' offset may be significantly mitigated if appropriate by modifying the circuit configuration such that, during the sampling phase, the voltage amplifiers are also included in the circuit during the sampling of the input voltages $V_{INP}$ and $V_{INN}$. FIG. 8 illustrates such an embodiment in circuit 80. FIG. 8A illustrates the electrical connections during a sampling phase of a specific implementation of this embodiment using inverting amplifiers 24 and 25. In FIG. 8A, during the sampling phase the parallel-configured capacitors are coupled between the input voltages $V_{INP}$ and $V_{INN}$ and the outputs of the amplifiers 24 and 25. The inputs of the amplifiers 24 and 25 in turn are coupled to the common-mode voltage $V_{CM}$. Thus, the portion of the charge stored during the sampling phase that is attributable to the offset of amplifiers 24 and 25 is effectively canceled out during the transfer phase whose electrical connection is shown in FIG. 8B.

In yet other aspects, voltage amplifiers' offset voltages may be advantageously employed.

For example, in switched-capacitor ADCs such as pipeline, algorithmic, and delta-sigma ADCs, the input voltage $V_{IN}$ is sampled, a quantized input voltage is subtracted from the sampled input voltage, and then the result is amplified by a fixed gain (e.g. via an operational amplifier) or integrated. The amplified result (e.g., output of an operational amplifier) typically is referred to as a "residue voltage," which is then passed to another stage of the ADC for further processing and/or for added resolution.

Figure 9:
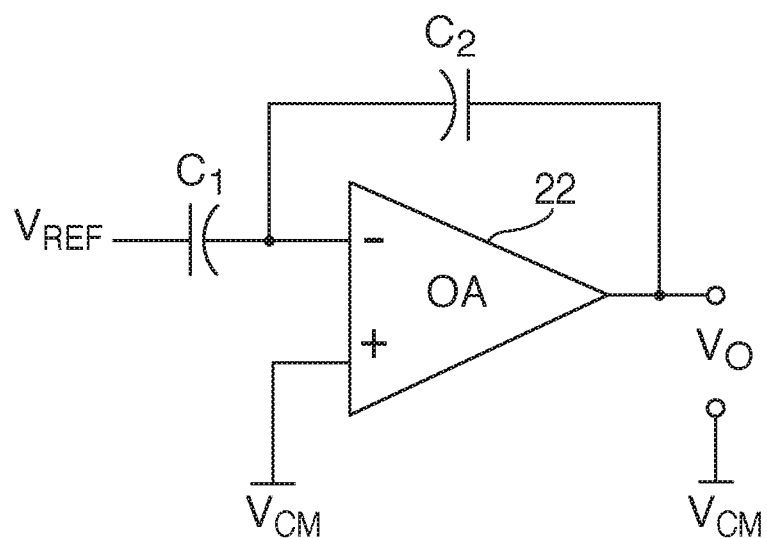
FIG. 9 illustrates the transfer phase of a circuit similar to that shown in FIG. 1B, in which a capacitor is coupled to a reference voltage instead of a common-mode voltage.

In some implementations of switched-capacitor ADCs, the quantized input voltage that is subtracted from the sampled input voltage is based at least in part on a reference voltage (i.e., some multiplier of a reference voltage represents the quantized input voltage, which is in turn subtracted from the sampled input voltage). Referring again for the moment to FIG. 1B which illustrates the transfer phase of the circuit 10 of FIG. 1, to accomplish such a subtraction of a reference voltage from the sampled input voltage, the capacitor $C_1$ may be coupled during the transfer phase to a reference voltage $V_{REF}$ (rather than coupling the capacitor $C_1$ to the common mode voltage $V_{CM}$ as shown in FIG. 1B). This situation is illustrated in FIG. 9. The output voltage $V_O$ in FIG. 9 is then given by:

$$V_O = (n+1)V_{IN} - nV_{REF} \quad (21)$$

where, depending on the polarity of the reference voltage $V_{REF}$, a multiple n of the absolute value of the reference voltage $V_{REF}$ may be added to or subtracted from a multiple (n+1) of the input voltage $V_{IN}$.

In some implementations of switched-capacitor ADCs, the quantized input voltage that is subtracted from a sampled input voltage is generated in part by the operation of a low resolution "flash ADC." As known in the art, a flash ADC employs a linear voltage ladder having a comparator at each rung of the ladder to compare the sampled input voltage to successive reference voltages. The resolution of the flash ADC (i.e., number of bits in the digital output code) may range from one to five bits, for example, in which the number of comparators required for the flash ADC relates to the number of bits (e.g., a 1-bit flash ADC includes a single comparator, while a 5-bit flash ADC includes 31 comparators). The subtraction of the quantized input voltage is performed by connecting one or more input capacitors to one or more reference voltages during the transfer phase of operation, wherein the number of input capacitors is based on the resolution (number of bits in the output code) of the flash ADC.

Figure 10:
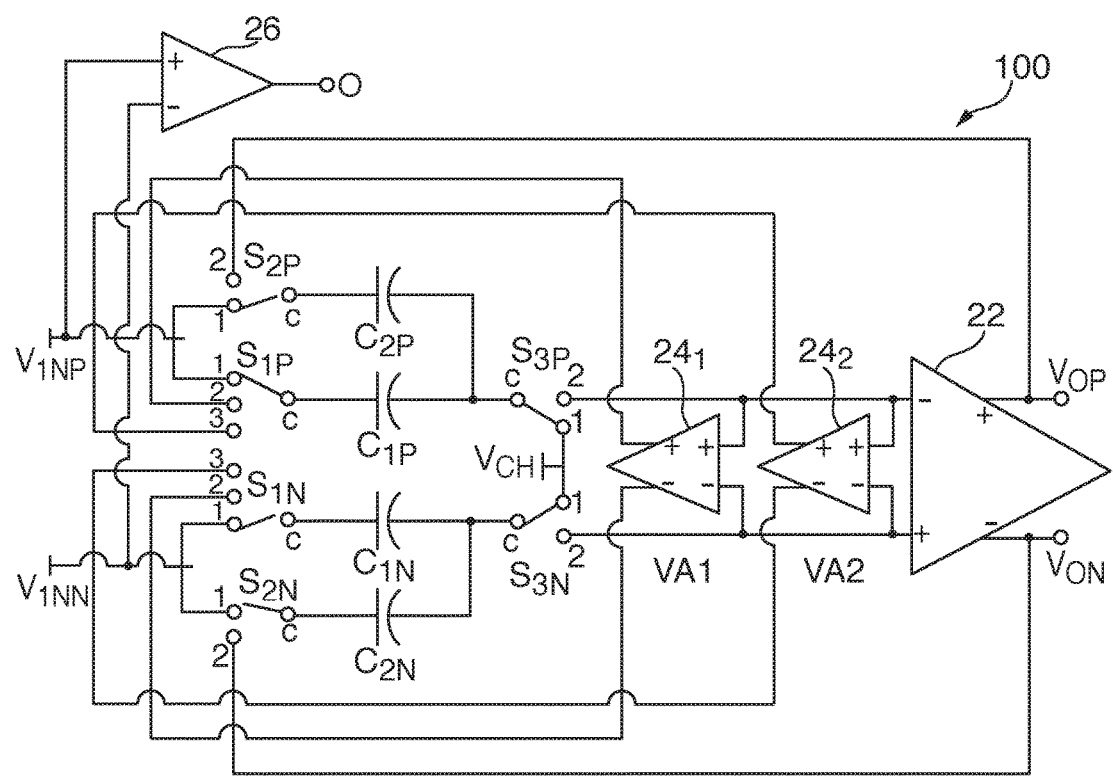
FIG. 10 illustrates a differential 1-bit per stage pipeline ADC stage including two level-shifting differential amplifiers, according to one embodiment of the present invention.
Figure 10A:
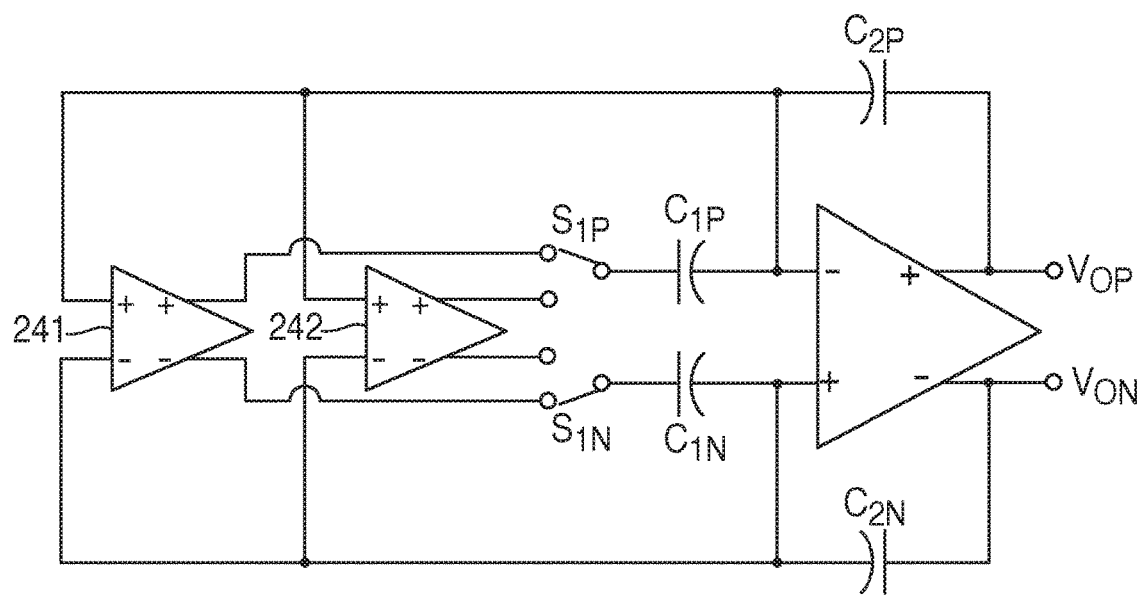
FIG. 10A illustrates a transfer phase of a differential 1-bit per stage pipeline ADC stage of FIG. 10, according to an embodiment of the present invention.

FIG. 10 illustrates an example, according to an embodiment, of a switched capacitor circuit 100 comprising a 1-bit per stage pipeline ADC stage with a 1-bit flash ADC comprising a single comparator 26. The circuit 100 of FIG. 10 also comprises two differential amplifiers $24_1$ and $24_2$ with different offset voltages to provide corresponding reference voltages $V_{REFP}$ and $V_{REFN}$ respectively. The switches $S_{1N}$, $S_{2P}$, $S_{2N}$, $S_{3P}$, and $S_{3N}$ are operated so as to configure the circuit 100 in a sampling phase and in a transfer phase, respectively. During the sampling phase of FIG. 10, the circuit 100 is electronically configured as shown in FIG. 10A, i.e., the positive input voltage $V_{INP}$ is applied across both capacitors $C_{1P}$ and $C_{2P}$ arranged in a parallel configuration, and the negative input voltage $V_{INN}$ is applied similarly across both capacitors $C_{1N}$ and $C_{2N}$ arranged in a parallel configuration, and input voltages $V_{INP}$ and $V_{INN}$ are applied to the comparator 26 of the 1-bit flash ADC. The differential input voltage $V_{IN}$ is equal to $V_{INP} - V_{INN}$, and the differential reference voltage $V_{REF}$ is equal to $V_{REFP} - V_{REFN}$.

According to an embodiment relating to the foregoing concept, the differential reference voltage $V_{REF}$ may be provided in the context of the benefits afforded by the portions of circuits shown in FIG. 3, FIG. 4 and FIG. 6 (i.e., transfer phase configurations that include one or more voltage amplifiers) by using an appreciable offset voltages of voltage amplifiers to provide the differential reference voltage $V_{REF}$. Such a voltage amplifier with an intentional and significant offset voltage is referred to herein as a "level-shifting voltage amplifier." With reference to FIG. 10 in which the differential amplifiers $24_1$ and $24_2$ are implemented as a resistor-loaded differential pair shown in FIG. 7A, the DC offset voltage $V_{OS}$ is the difference between the quiescent DC output voltage and the input voltage. Since the nominal DC input voltage is at $V_{CM}$, and the DC output voltage of the amplifier $24_1$ is at $V_{DD} - R_1 I_{SS1}/2$, where $R_1$ and $I_{SS1}$ are the value of the load resistors and the bias current of the in amplifier $24_1$, respectively. Correspondingly, the first reference voltage $V_{REFP}$ provided by the amplifier $24_1$ is $V_{DD} - V_{CM} - R_1 I_{SS1}/2$. Since the nominal DC input voltage is at $V_{CM}$, and the DC output voltage of the amplifier $24_2$ is at $V_{DD} - R_2 I_{SS2}/2$, where $R_2$ and $I_{SS2}$ are the value of the load resistors and the bias current of the in amplifier $24_2$, respectively. The second reference voltage $V_{REFN}$ provided by the amplifier $24_2$ is $V_{DD} - V_{CM} - R_2 I_{SS2}/2$. The difference between the two offsets, $V_{REFP} - V_{REFN}$ may be utilized to provide the addition or subtraction of a reference voltage to or from a multiple of the input voltage $V_{IN}$, presuming that the amplifiers $24_1$ and $24_2$ are not included in the circuit configuration of the sampling phase (i.e., the configuration shown in FIG. 8 is not employed in this embodiment). More specifically, in this embodiment, during the sampling phase the positive input voltage $V_{INP}$ is sampled on capacitors $C_{1P}$ and $C_{2P}$, and the negative input voltage $V_{INN}$ is sampled on capacitors $C_{1N}$ and $C_{2N}$, respectively, both with reference to the system common-mode voltage $V_{CM}$ (see FIG. 1A). During the transfer phase, the capacitors $C_{1P}$ and $C_{1N}$ are driven by the amplifiers $24_1$ and $24_2$ depending on the output D of the comparator as shown in FIG. 10A where electrical connections during the transfer phase are shown. If the comparator output D is "1", the switch $S_{1P}$ is thrown to position "2" and the switch $S_{1N}$ is thrown to position "3". This applies the offset voltage of the amplifier $24_1$ to the capacitor $C_{1P}$ and the offset voltage of the amplifier $24_2$ to the capacitor $C_{1N}$, effectively subtracting the reference voltage $V_{REF}$ from the differential residue voltage. On the other hand, if the comparator output D is "0", the switch $S_{1P}$ is thrown to position "3" and the switch $S_{1N}$ is thrown to position "2". This applies the offset voltage of the amplifier $24_2$ to the capacitor $C_{1P}$ and the offset voltage of the amplifier $24_1$ to the capacitor $C_{1N}$, effectively adding the reference voltage $V_{REF}$ from the differential residue voltage.

In differential ADCs, it is desired to either subtract or add the reference voltage from the residue depending on the digital codes. The subtraction of the positive reference voltage $V_{REFP}$ from a sampled input voltage can be accomplished with a voltage amplifier having a positive offset voltage, while the addition of the negative reference voltage $V_{REFN}$ from a sampled input voltage can be accomplished with a voltage amplifier having a negative offset voltage. The effective reference voltage $V_{REF}$ is the difference $V_{REFP}-V_{REFN}$. Also, in some implementations the voltage $V_{REF}$ may be adjusted such that a desired absolute value for $V_{REF}$ may be added or subtracted.

In the sampling phase, the comparator 26 of the flash ADC compares the differential input voltage $V_{IN}$ with 0 and provides as an output a 1-bit digital output code D according to:

$$D=1 \text{ if } V_{IN}>0$$

$$D=-1 \text{ if } V_{IN}<0 \qquad (22)$$

During the transfer phase shown in FIG. 10A, one of the states of the 1-bit digital output code D operates the switches $S_{1P}$ and $S_{1N}$ so as couple the input capacitors $C_{1P}$ to the positive reference voltage $V_{REFP}$ provided by the output $V_{OP1}$ of the amplifier $24_1$ (VA1), and the input capacitor $C_{1N}$ and to the negative reference voltage $V_{REFN}$ provided by the output $V_{ON2}$ of the amplifier $24_2$ (VA2). The other of the states of D operates the switches $S_{1P}$ and $S_{1N}$ so as couple the input capacitor $C_{1P}$ to the negative reference voltage $V_{REFN}$ provided by the output $V_{OP2}$ of the amplifier $24_1$ (VA1), and the input capacitor $C_{1N}$ and to the positive reference voltage $V_{REFP}$ provided by the output $V_{ON1}$ of the amplifier $24_2$ (VA2).

If $C_1=C_2$, the differential output voltage is given by:

$$V_O = 2(V_{INP} - V_{INN}) - D(V_{REFP} - V_{REFN}) \qquad (23)$$
$$= 2V_{IN} - DV_{REF}$$

In one exemplary implementation, the absolute value of the two reference voltages $V_{REF1}$ and $V_{REF2}$ (provided by the offset voltages of the voltage amplifiers VA1 and VA2, respectively) may be the same, and the respective reference voltages may have opposite polarities. In this example, accordingly the absolute value of the differential reference voltage $V_{REF}$ is added as a quantized input voltage to the sampled differential input voltage $V_{IN}$ during the transfer phase for one state of D, and for the other state of D the absolute value of the differential reference voltage $V_{REF}$ is subtracted as a quantized input voltage from the sampled differential input voltage $V_{IN}$ during the transfer phase. However, it should be appreciated that in other embodiments the respective absolute values for the reference voltages $V_{REFP}$ and $V_{REFP}$ may be different, and/or the respective polarities of the reference voltages $V_{REFP}$ and $V_{REFP}$ may be the same; thus a variety of respective reference voltages are contemplated in different inventive embodiments.

As discussed above, in various embodiments, a reference voltage may be realized via a particular implementation of a level-shifting voltage amplifier giving rise to a particular offset voltage for the voltage amplifier. A given reference voltage that is ultimately selected via the 1-bit output signal D of the flash ADC and the switches $S_{1P}$ and $S_{1N}$ are applied as a quantized input voltage to the sampled differential input voltage $V_{IN}$ to provide an differential output voltage $V_O$ according to Equation (19) above, which may serve as a residue voltage (e.g., in a given stage of a pipeline ADC).

As discussed above in connection with FIG. 5 and FIG. 7, various examples of implementations of level-shifting amplifiers $24_1$ and $24_2$ are contemplated according to various inventive embodiments disclosed herein. Gain and offset adjustment may be provided as described in conjunction with various examples of implementations in FIG. 5A through FIG. 5C, and FIG. 7A through FIG. 7E.

Figure 11A:
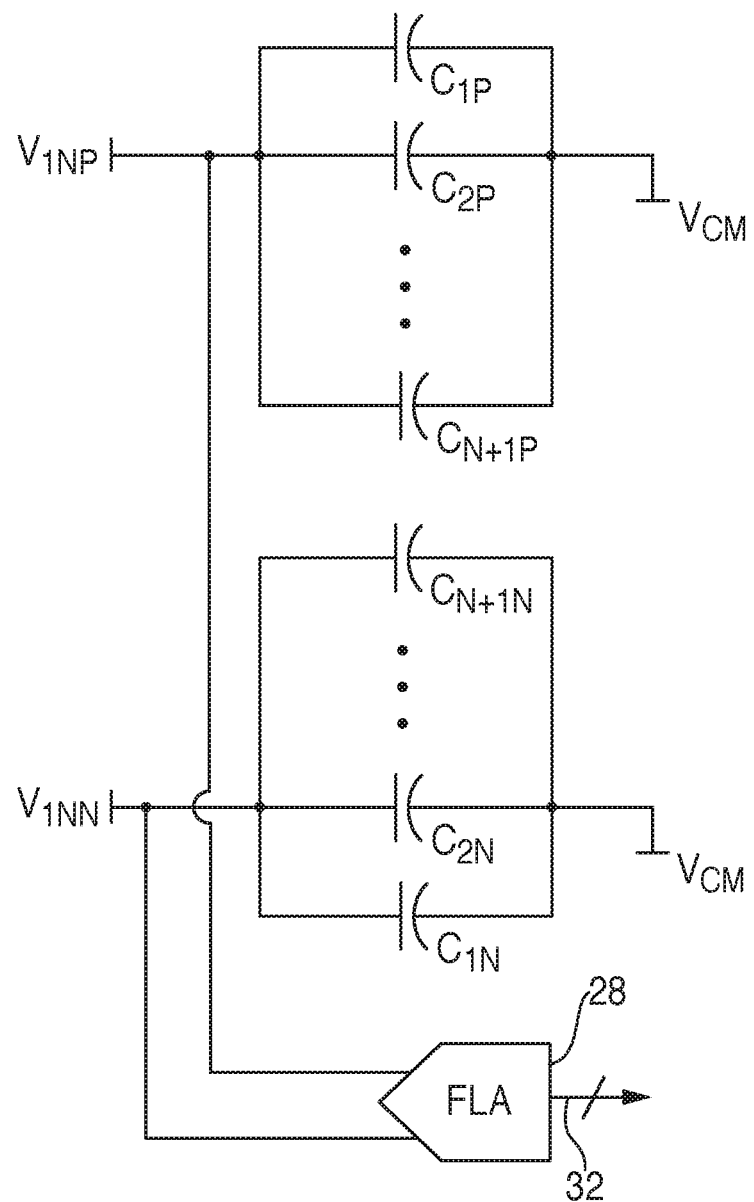
FIG. 11A illustrates a sampling phase of a multi-bit per stage pipeline stage, according to an embodiment of the present invention.
Figure 11B:
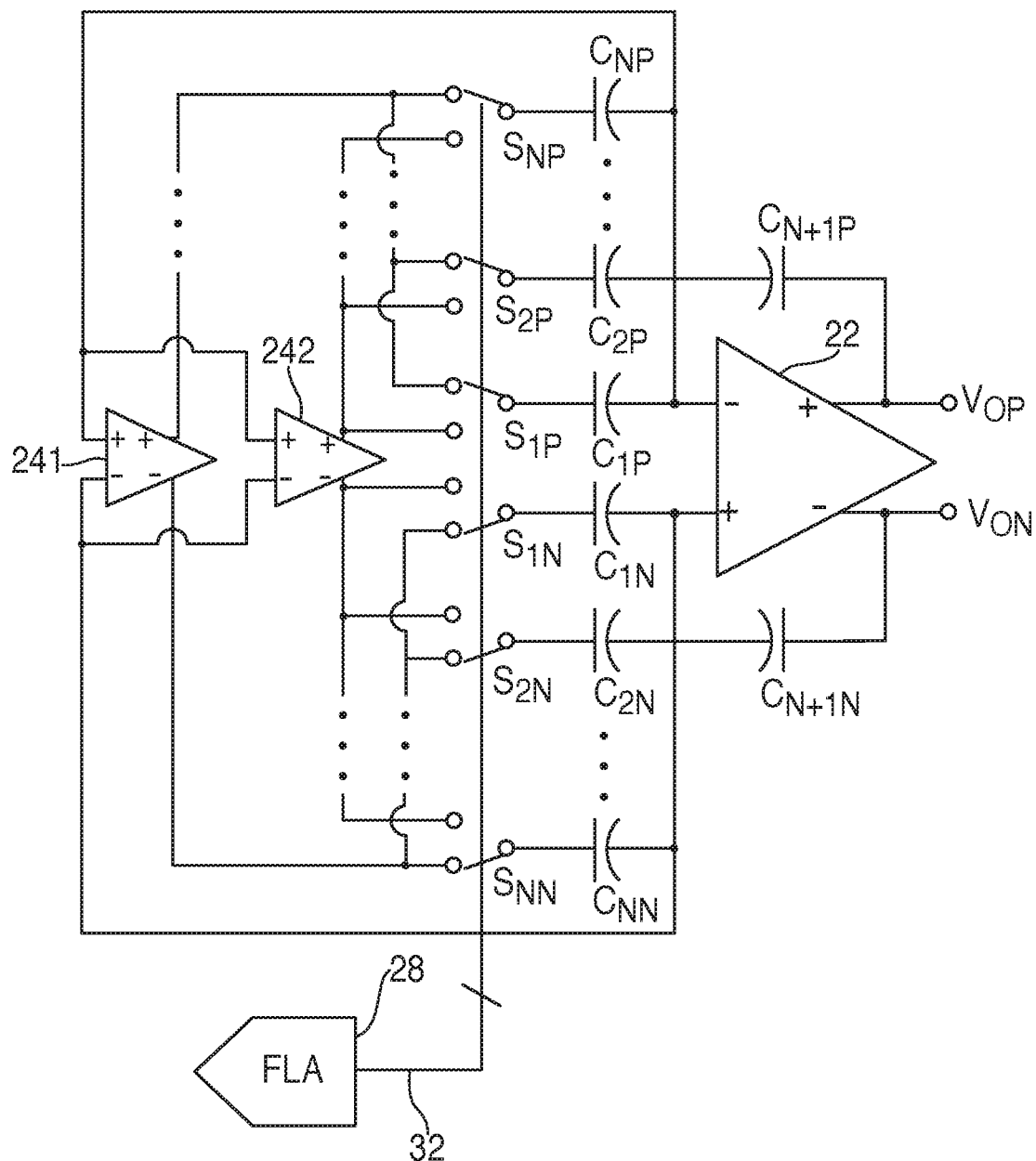
FIG. 11B illustrates a transfer phase of a multi-bit per stage pipeline stage, according to an embodiment of the present invention.

In yet another embodiment shown in FIG. 11A and FIG. 11B, a multi-bit per stage pipeline stage is provided comprising a multi-bit flash ADC 28 (FLA) providing an M-bit digital output code 32, and a plurality of positive input capacitors $C_{1P}$-$C_{NP}$ and a plurality of negative input capacitors $C_{1N}$-$C_{NN}$ that are switched during the transfer phase to the outputs of two voltage amplifiers VA1 or VA2 depending on the flash ADC output code 32 in a similar manner described in conjunction with the single-bit per stage ADC shown in FIG. 10. In exemplary implementations, the number N of input capacitors is $2^M-1$ (where M is the number of bits of the digital output code 32). During the sampling phase shown in FIG. 11A, the positive input voltage $V_{INP}$ is applied similarly across multiple positive input capacitors $C_{1P}$-$C_{NP}$ and the integration capacitor $C_{N+1P}$ arranged in a parallel configuration, the negative input voltage $V_{INN}$ is applied similarly across multiple negative input capacitors $C_{1N}$-$C_{NN}$ and the integration capacitor $C_{N+1N}$ arranged in a parallel configuration, and to the FLA 28. During the transfer phase shown in FIG. 11B, a plurality of switches ($S_{1P}$-$S_{NP}$) and ($S_{1N}$-$S_{NN}$) are operated by the output code 32 of the FLA 28 to couple one or more of the positive input capacitors $C_{1P}$-$C_{NP}$ to outputs $V_{OP1}$ and $V_{OP2}$ the voltage amplifiers $24_1$ and $24_2$, respectively, and one or more of the negative input capacitors $C_{1N}$-$C_{NN}$ to outputs $V_{ON1}$ and $V_{ON2}$ the voltage amplifiers $24_1$ and $24_2$, respectively, so as to provide a quantized input voltage to be added to or subtracted from the sampled differential input voltage $V_{IN}$. More specifically, during the transfer phase, at least one of the plurality of input capacitors, the integration capacitor, and the one of the first voltage amplifier and the second voltage amplifier are coupled to the operational amplifier, based at least in part on the M-bit digital output code 32 of the flash ADC FLA 28, to subtract a fraction of the corresponding differential reference voltage from the input voltage so as to provide the output voltage from the operational amplifier, wherein the fraction is based at least in part on a digital value of the M-bit digital output code 32.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

What is claimed is:

1. A differential switched capacitor circuit operable in a sampling phase and a transfer phase, the switched capacitor circuit comprising:
    a plurality of switches;
    at least one input capacitor having a first capacitance value;
    at least one integration capacitor having a second capacitance value;
    an operational amplifier; and
    at least one voltage amplifier whose input is electrically coupled to an input of the operational amplifier, wherein:
        a magnitude of a voltage gain of the at least one voltage amplifier is greater than 1;
        during the sampling phase, the plurality of switches are configured to couple a first input voltage to the at least one input capacitor; and
        during the transfer phase, the plurality of switches are configured to couple the at least one input capacitor, the at least one integration capacitor, and the at least one voltage amplifier to the input of the operational amplifier to transfer charge from the at least one input capacitor to the at least one integration capacitor.

2. The circuit of claim 1, further comprising at least one parasitic capacitance having a third capacitance value, the at least one parasitic capacitance coupled to the input of the operational amplifier, wherein an absolute value of the voltage gain of the at least one voltage amplifier is substantially equal to a sum of the first and the third capacitance values divided by the first capacitance value.

3. The circuit of claim 1, further comprising at least one parasitic capacitance coupled to the input of the operational amplifier, wherein an absolute value of the voltage gain of the at least one voltage amplifier is greater than a sum of the first and the third capacitance values divided by the first capacitance value.

4. The circuit of claim 3, wherein the absolute value of the voltage gain of the at least one voltage amplifier is substantially equal to a sum of the first, second, and the third capacitance values divided by the first capacitance value.

5. The circuit of claim 1, wherein the at least one voltage amplifier is an inverting amplifier.

6. The circuit of claim 5, further comprising at least one parasitic capacitance having a third capacitance value, the at least one parasitic capacitance coupled to the input of the operational amplifier, wherein an absolute value of the voltage gain of the at least one voltage amplifier is substantially equal to a sum of the first and the third capacitance values divided by the first capacitance value.

7. The circuit of claim 5, further comprising at least one parasitic capacitance coupled to the input of the operational amplifier, wherein an absolute value of the voltage gain of the at least one voltage amplifier is greater than a sum of the first and the third capacitance values divided by the first capacitance value.

8. The circuit of claim 7, wherein the absolute value of the voltage gain of the at least one voltage amplifier is substantially equal to a sum of the first, second, and the third capacitance values divided by the first capacitance value.

9. The circuit of claim 1, wherein the at least one voltage amplifier is a non-inverting amplifier.

10. The circuit of claim 1, wherein the at least one voltage amplifier is a differential amplifier.

11. The circuit of claim 10, further comprising at least one parasitic capacitance having a third capacitance value, the at least one parasitic capacitance coupled to the input of the operational amplifier, wherein an absolute value of the voltage gain of the at least one voltage amplifier is substantially equal to a sum of the first and the third capacitance values divided by the first capacitance value.

12. The circuit of claim 10, further comprising at least one parasitic capacitance coupled to the input of the operational amplifier, wherein an absolute value of the voltage gain of the at least one voltage amplifier is greater than a sum of the first and the third capacitance values divided by the first capacitance value.

13. The circuit of claim 12, wherein the absolute value of the voltage gain of the at least one voltage amplifier is substantially equal to a sum of the first, second, and the third capacitance values divided by the first capacitance value.

14. The circuit of claim 1, further comprising a second input voltage, wherein the first input voltage and the second input voltage have a substantially same absolute value and an opposite polarity.

15. The circuit of claim 1, wherein:
the at least one voltage amplifier includes a first voltage amplifier and a second voltage amplifier;
the first voltage amplifier provides a first offset voltage on which a first reference voltage is based;
the second voltage amplifier provides a second offset voltage on which a second reference voltage is based; and
during the transfer phase, the plurality of switches are configured to couple the at least one input capacitor, the at least one integration capacitor, and one of the first voltage amplifier and the second voltage amplifier to the input of the operational amplifier to subtract or add a corresponding one of the first reference voltage and the second reference voltage from an output voltage of the operational amplifier.

16. The circuit of claim 15, further comprising at least one parasitic capacitance having a third capacitance value, the at least one parasitic capacitance coupled to the input of the operational amplifier, wherein an absolute value of the voltage gain of the at least one voltage amplifier is substantially equal to a sum of the first and the third capacitance values divided by the first capacitance value.

17. The circuit of claim 15, further comprising at least one parasitic capacitance coupled to the input of the operational amplifier, wherein an absolute value of the voltage gain of the at least one voltage amplifier is greater than a sum of the first and the third capacitance values divided by the first capacitance value.

18. The circuit of claim 17, wherein the absolute value of the voltage gain of the at least one voltage amplifier is substantially equal to a sum of the first, second, and the third capacitance values divided by the first capacitance value.

19. The circuit of claim 15, wherein the at least one of the first voltage amplifier and the second voltage amplifier is a differential amplifier.

20. The circuit of claim 19, further comprising at least one parasitic capacitance having a third capacitance value, the at least one parasitic capacitance coupled to the input of the operational amplifier, wherein an absolute value of the voltage gain of the at least one voltage amplifier is substantially equal to a sum of the first and the third capacitance values divided by the first capacitance value.

21. The circuit of claim 19, further comprising at least one parasitic capacitance coupled to the input of the operational amplifier, wherein an absolute value of the voltage gain of the at least one voltage amplifier is greater than a sum of the first and the third capacitance values divided by the first capacitance value.

22. The circuit of claim 21, wherein the absolute value of the voltage gain of the at least one voltage amplifier is substantially equal to a sum of the first, second, and the third capacitance values divided by the first capacitance value.

23. The circuit of claim 15, wherein at least one of the first voltage amplifier and the second voltage amplifier is a non-inverting amplifier.

24. The circuit of claim 15, wherein at least one of the first voltage amplifier and the second voltage amplifier is a differential amplifier.

25. The circuit of claim 24, further comprising at least one parasitic capacitance having a third capacitance value, the at least one parasitic capacitance coupled to the input of the operational amplifier, wherein an absolute value of the voltage gain of the at least one voltage amplifier is substantially equal to a sum of the first and the third capacitance values divided by the first capacitance value.

26. The circuit of claim 24, further comprising at least one parasitic capacitance coupled to the input of the operational amplifier, wherein an absolute value of the voltage gain of the at least one voltage amplifier is greater than a sum of the first and the third capacitance values divided by the first capacitance value.

27. The circuit of claim 26, wherein the absolute value of the voltage gain of the at least one voltage amplifier is substantially equal to a sum of the first, second, and the third capacitance values divided by the first capacitance value.

28. The circuit of claim 15, further comprising an M-bit flash analog-to-digital converter (ADC) to control at least some of the plurality of switches during the transfer phase, based on the first input voltage, to select one of the first voltage amplifier and the second voltage amplifier.

29. The circuit of claim 28, wherein:
during the sampling phase, the first input voltage is applied to an input of the M-bit flash ADC to provide an M-bit digital output code based at least in part on the first input voltage; and
during the transfer phase, the M-bit digital output code controls the at least some of the plurality of switches to select the one of the first voltage amplifier and the second voltage amplifier,
wherein M is an integer greater than or equal to 1.

30. The circuit of claim 29, wherein M=1 and the at least one input capacitor includes only a first input capacitor.

31. The circuit of claim 29, wherein:
M is an integer greater than 1;
the at least one input capacitor includes a plurality of input capacitors;
a number N of the plurality of input capacitors is equal to $2^M-1$; and
during the transfer phase, the at least some of the plurality of switches are controlled by the M-bit digital output code of the flash ADC to couple at least one of the plurality of input capacitors, the at least one integration capacitor, and the one of the first voltage amplifier and the second voltage amplifier to the input of the operational amplifier to subtract a fraction of the corresponding one of the first reference voltage and the second reference voltage from the output voltage of the operational amplifier, wherein the fraction is based at least in part on a digital value of the M-bit digital output code.

32. A charge transfer method, comprising:
A) sampling at least one input voltage during a sampling phase; and
B) subtracting, using an operational amplifier, at least a first reference voltage from the at least one input voltage during a transfer phase, the first reference voltage being provided by at least one voltage amplifier, wherein a voltage gain of the at least one voltage amplifier is greater than one, and an output voltage of the at least one voltage amplifier is referenced to an input of the operational amplifier,
wherein A) and B) are performed using a same set of at least two capacitors for both the sampling phase and the transfer phase.

33. The method of claim 32, wherein a magnitude of the voltage gain of the at least one voltage amplifier is determined by the set of at least two capacitors.

34. The method of claim 33, wherein the at least one input voltage comprises a first input voltage and a second input voltage, the at least two capacitors include at least one input capacitor and at least one integration capacitor, and wherein:
A) comprises coupling the first input voltage to the at least one input capacitor and coupling the second input voltage to the at least one integration capacitor; and
B) comprises coupling the at least one input capacitor, the at least one integration capacitor, and the at least one voltage amplifier to the input of the operational amplifier to subtract at least the first reference voltage from an output voltage of the operational amplifier based on the first input voltage and the second input voltage.

35. The method of claim 34, wherein at least one of respective absolute values and respective polarities of the first input voltage and the second input voltage are different.

36. The method of claim 34, wherein the first input voltage and the second input voltage have a substantially same absolute value and a same polarity.

37. The method of claim 34, wherein the second input voltage is one of a common mode voltage and ground.

38. The method of claim 34, wherein the sum voltage is based on a multiple n of at least the first input voltage, and the multiple n is based on a ratio of a first capacitance value $C_1$ of the at least one input capacitor and a second capacitance value $C_2$ of the at least one integration capacitor, wherein n is an integer greater than or equal to 1.

39. The method of claim 34, wherein:
the at least one voltage amplifier includes a first voltage amplifier and a second voltage amplifier;
the first voltage amplifier provides a first offset voltage on which the first reference voltage is based;
the second voltage amplifier provides a second offset voltage on which a second reference voltage is based; and
B) comprises coupling the at least one input capacitor, the at least one integration capacitor, and one of the first voltage amplifier and the second voltage amplifier to the input of the operational amplifier to add or subtract a corresponding one of the first reference voltage and the second reference voltage from the sum voltage so as to provide the output voltage from the operational amplifier.

40. The method of claim 39, wherein the first reference voltage and the second reference voltage have opposite polarities.

41. The method of claim 40, wherein the first reference voltage and the second reference voltage have a substantially same absolute value.

42. The method of claim 39, wherein:
A) further comprises coupling the first input voltage to an M-bit flash analog-to-digital converter (ADC) to provide an M-bit digital output code from the M-bit flash ADC based at least in part on the first input voltage; and
B) further comprises selecting one of the first voltage amplifier and the second voltage amplifier based at least in part on the M-bit digital output code,
wherein M is an integer greater than or equal to 1.

43. The method of claim 42, wherein M=1 and the at least one input capacitor includes only a first input capacitor.

44. The method of claim 42, wherein:
M is an integer greater than 1;
the at least one input capacitor includes a plurality of input capacitors;
a number N of the plurality of input capacitors is equal to $2^M-1$; and
B) further comprises coupling, based at least in part on the M-bit digital output code, at least one of the plurality of input capacitors, the at least one integration capacitor, and the one of the first voltage amplifier and the second voltage amplifier to the input of the operational amplifier to subtract a fraction of the corresponding one of the first reference voltage and the second reference voltage from the sum voltage so as to provide the output voltage from the operational amplifier, wherein the fraction is based at least in part on a digital value of the M-bit digital output code.

45. The method of claim 32, wherein the at least one input voltage comprises a first input voltage and a second input voltage, and wherein:
A) further comprises coupling an opposite polarity copy of the at least one input voltage to at least one second input capacitor; and
B) further comprises coupling the at least one second input capacitor, at least one second integration capacitor, and the at least one second voltage amplifier to the input of the operational amplifier to subtract at least the first reference voltage from an output voltage of the operational amplifier based on the first input voltage and the second input voltage.

46. The method of claim 45, wherein the first reference voltage is based at least in part on a first offset voltage of the at least one second voltage amplifier.

47. The method of claim 46, wherein the at least one second voltage amplifier includes a source follower circuit configuration.

48. The method of claim 47, wherein the source follower circuit configuration includes at least one MOS transistor, and wherein the first offset voltage is based at least in part on a gate-source voltage of the at least one MOS transistor.

* * * * *